US008200325B2

(12) United States Patent
Sarpeshkar et al.

(10) Patent No.: US 8,200,325 B2
(45) Date of Patent: Jun. 12, 2012

(54) MICROPOWER NEURAL AMPLIFIER WITH ADAPTIVE INPUT-REFERRED NOISE

(75) Inventors: Rahul Sarpeshkar, Arlington, MA (US); Benjamin I. Rapoport, New York, NY (US); Woradorn Wattanapanitch, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1014 days.

(21) Appl. No.: 12/127,475

(22) Filed: May 27, 2008

(65) Prior Publication Data
US 2008/0290944 A1 Nov. 27, 2008

Related U.S. Application Data

(60) Provisional application No. 60/940,105, filed on May 25, 2007.

(51) Int. Cl.
*A61B 5/04* (2006.01)
*H03F 3/45* (2006.01)
(52) U.S. Cl. ........................ 600/544; 330/261
(58) Field of Classification Search .................. 600/300, 600/301, 544, 545; 330/257, 261
See application file for complete search history.

(56) References Cited

U.S. PATENT DOCUMENTS

| 5,399,992 A | 3/1995 | Itakura et al. | |
|---|---|---|---|
| 2003/0155966 A1* | 8/2003 | Harrison | 330/9 |
| 2006/0122529 A1 | 6/2006 | Tsau | |
| 2007/0241818 A1* | 10/2007 | Alenin et al. | 330/257 |

FOREIGN PATENT DOCUMENTS
WO 2006130828 12/2006

OTHER PUBLICATIONS

Ferri, "Low-Voltage Low-Power Adaptive Biased High-Efficiency Integrated Amplifiers" Electronics, Circuits and Systems, 2001. ICECS 2001. The 8th IEEE International Conference on Sep. 2-5, 2001, vol. 3, pp. 1529-1532.
Cardarilli et al., "CMOS adaptive biasing circuits for low-power applications" Proc. 21st International Conference on Microelectronics, vol. 2, Sep. 14-17, 1997, pp. 747-750.
Galan et al., "Super Class-AB OTAs with Adaptive Biasing and Dynamic Output Current Scaling" IEEE Transactions on Circuits and Systems-1:Regular Papers, vol. 54, No. 3, Mar. 2007, pp. 449-457.
Lopez-Martin et al., "Power-Efficient Super Class AB OTAs" Solid State Circuits Conference, 2004. Proceedings of the 30th European Leuven, Belgium Sep. 21-23, 2004, pp. 231-234.
Wessberg et al., "Real-time prediction of hand trajectory by ensembles of cortical neurons in primates" Letters to Nature, Nature vol. 408, Nov. 16, 2000, pp. 361-365.
Chapin et al., "Real-time control of a robot arm using simultaneously recorded neurons in the motor cortex" 1999 Nature America, Inc., vol. 2, No. 7, Jul. 1999, pp. 664-670.

(Continued)

*Primary Examiner* — Miranda Le
*Assistant Examiner* — Tiffany Weston
(74) *Attorney, Agent, or Firm* — Gesmer Updegrove LLP

(57) ABSTRACT

A micropower neural amplifier with adaptive power biasing for use in multi-electrode arrays is provided. The micropower neural amplifier includes a low noise gain stage. The low noise gain stage is implemented using an amplifier and pseudoresistor elements.

21 Claims, 19 Drawing Sheets

OTHER PUBLICATIONS

Perelman et al., "An Integrated System for Multichannel Neuronal Recording With Spike/LFP Separation, Integrated A/D Conversion and Threshold Detection" IEEE Transactions of Biomedical Engineering, vol. 54, No. 1, Jan. 2007, pp. 130-137.

Harrison et al., "A Low-Power Integrated Circuit for a Wireless 100-Electrode Neural Recording System" IEEE Journal of Solid-State Circuits, vol. 42, No. 1, Jan. 2007, pp. 123-133.

Olsson et al., "Band-Tunable and Multiplexed Integrated Circuits for Simultaneous Recording and Stimulation with Microelectrode Arrays" IEEE Transactions on Biomedical Engineering, vol. 52, No. 7, Jul. 2005, pp. 1303-1311.

Harrison et al., "A Low-Power Noise CMOS-Amplifier for Neural Recording Applications" IEEE Journal of Solid-State Circuits, vol. 38, No. 6, Jun. 2003, pp. 958-965.

Mohensi et al., "A Fully Integrated Neural recording Amplifier with DC Input Stabilization" IEEE Transactions on Biomedical Engineering, vol. 51, No. 5., May 2004, pp. 832-837.

Wattanapanitch et al., "An Energy Efficient Micropower Neural Recording Amplifier" IEEE Transactions on Biomedical Circuits and Systems, vol. 1, No. 2, Jun. 2007, pp. 136-147.

Guillory et al., "A 100-Channel system for real time detection and storage of extracellular spike waveforms" Journal of Neuroscience Methods 91, 1999, pagers 21-29.

Sarpeshkar et al., "A Low-Power Wide-Linear-Range Transconductance Amplifier" Analog Integrated Circuits and Signal Processing, 13, 1997, pp. 123-151.

Mavoori et al., "An autonomous implantable computer for neural recording and stimulation in unrestrained primates" Journal of Neuroscience Methods, 148, 2005, pp. 71-77.

Delbruck et al., "Adaptive Photoreceptor with Wide Dynamic Range" Dept. of Computation and Neural Systems California Institute of Technology, pp. 339-342.

Delbruck et al., "Analog VLSI Adaptive. Logarithmic Wide-Range-Dynamic Range Photoreceptor" Dept. of Computation and Neural Systems California Institute of Technology, pp. 1-4.

Enz et al., "An Analytical MOS Transistor Model Valid in All Regions of Operation and Dedicated to Low-Voltage and Low-Current Applications" Analog Integrated Circuits and Signal Processing, 8, 1995, pp. 83-114.

Steyaert et al., "A Micropower Low-Noise Monolithic Instrumentation Amplifier for Medical Purposes" IEEE Journal of Solid-State Circuits,1987, vol. 22, No. 6, pp. 1163-1168.

Scherberger et al., "Cortical Local Field Potential Encodes Movement Intentions in Posterior Parietal Cortex" Neuron, vol. 46, 2005, pp. 347-354.

* cited by examiner

MICROPOWER NEURAL AMPLIFIER WITH ADAPTIVE INPUT-REFERRED NOISE

PRIORITY INFORMATION

This application claims priority from provisional application Ser. No. 60/940,105 filed May 25, 2007, which is incorporated herein by reference in its entirety.

SPONSORSHIP INFORMATION

This invention was made with government support under grant number DGE0645960 awarded by the National Science Foundation. The government has certain rights in this invention.

BACKGROUND OF THE INVENTION

The invention relates to the field of neural recording amplifier, and in particular to an ultra-low-power neural recording amplifier.

Large-scale chronic multi-electrode neural-recording systems are being built to enable us to understand how the brain works. With the help of such systems, a number of experiments have shown that it is possible to predict intended limb movements by simultaneously recording from many neurons, and interpreting their cortical activities. For example, brain-machine interfaces are being built to help a paralyzed patient move a computer cursor by thoughts alone. Portable, chronic use of such interfaces may eventually play an important role in treatment of paralyzed patients, and enable large-scale monitoring of the brain in experimental neuroscience.

One of the most important parts in the development of brain-machine interfaces is the neural signal amplifier. Neural signals from extracellular recording are very weak (typically between 10 μV and 500 μV). As a result, amplification is needed before such signals can be processed further. Next generation multi-electrode recording systems will be entirely implanted within the skull and incorporate a large number of neural amplifiers (on the order of 100-1000, one for every electrode). For such applications, ultra-low-power operation is very important to minimize heat dissipation in the brain, preserve long-battery life, and maximize the time between recharges. To get clean neural signal recordings, it is important that the input-referred noise of the amplifier be kept low. Practically, the input-referred noise of the amplifier should be kept below the background noise of the recording site (5 μV-10 μV). However, designers must address the tradeoff between low-noise and low-power designs of the amplifier. For an ideal thermal noise-limited amplifier with a constant bandwidth and supply voltage, the power of the amplifier scales as $1/v_n^2$ where $v_n$ is the input-referred noise of the amplifier. This relationship shows the steep power cost of achieving low-noise performance in an amplifier.

Many designs of neural amplifiers have been reported in the literature. Most amplifiers consume power near 100 μW to achieve less than 10 μV $V_{rms}$ input-referred noise for bandwidths of 5-10 kHz. The designs consume power near 100 μW to achieve about 8-9 μV$_{rms}$ input-referred noise with approximately 10 kHz of bandwidth. The design in [8] achieves an input-referred noise of 2.2 μV $V_{rms}$ with 7.2 kHz of bandwidth while consuming 80 μW of power. If such amplifiers are to be used in a multi-electrode array, with a power near 100 μW per amplifier for most designs, the power required for the neural amplifiers can become the limiting factor for the whole multi-electrode system.

The best prior design presents many useful techniques for designing a neural amplifier: The use of an MOS-bipolar pseudoresistor element as a high-resistance element and on-chip AC-coupling capacitors enable the amplifier to reject large DC offsets at electrode-tissue interfaces while being able to pass the neural signals of interest. Since high-resistance elements can be implemented in a small area on chip, large off-chip components are not needed. The amplifier in uses a standard wide-output swing operational transconductance amplifier (OTA) with capacitive feedback to realize a gain of approximately 40 dB, and presents design techniques that minimize the input-referred noise of the amplifier by operating some devices of the OTA in strong inversion to minimize their noise contributions. Even though the latter design achieves a power-noise tradeoff near theoretical limit of its particular OTA topology, the topology used is not power-efficient since a large portion of the current in it is wasted in its current mirrors. The power efficiency of an amplifier can be greatly improved if a new OTA topology that makes efficient use of the supply current can be created.

SUMMARY OF THE INVENTION

According to one aspect of the invention, there is provided a micropower neural amplifier with adaptive power biasing for use in multi-electrode arrays. The micropower neural amplifier includes a low noise gain stage, the low noise gain stage implemented using an amplifier and pseudoresistor elements. A band pass filter stage shapes a pass band of the amplifier.

According to another aspect of the invention, there is provided a micropower neural amplifier with adaptive power biasing for use in multi-electrode arrays. The micropower neural amplifier includes a low noise gain stage. The low noise gain stage is implemented using an amplifier and pseudoresistor elements. The MOS-bipolar pseudoresistor element's noise being in the low frequencies, thereby allowing the low frequency noise to be filtered prior to pass band and does not appear in a frequency of interest. A band pass filter stage shapes a pass band of the amplifier.

According to another aspect of the invention, there is provided a micropower neural amplifier with adaptive power biasing for use in multi-electrode arrays. The micropower neural amplifier includes a low noise gain stage. The low noise gain stage is implemented using an amplifier and pseudoresistor elements. The amplifier is implemented using a modified version of a standard folded-cascode topology. The modification involves biasing an operational transconductance amplifier such that only currents in transistors of a folded branch are only a fraction of the current in the input differential pair transistors. A band pass filter stage shapes a pass band of the amplifier.

According to another aspect of the invention, there is provided a method of forming a micropower neural amplifier with adaptive power biasing for use in multi-electrode arrays. The method includes implementing a low noise gain stage using an amplifier and pseudoresistor elements. The pseudoresistor element's noise being in the low frequencies, thereby allowing the low frequency noise to be filtered prior to pass band and does not appear in a frequency of interest. Also, the method includes implementing a band pass filter stage shapes a pass band of the amplifier.

According to another aspect of the invention, there is provided a method of performing operations of a micropower neural amplifier with adaptive power biasing for use in multi-transconductance amplifier and pseudoresistor elements in a low noise gain stage. The pseudoresistor element's noise is in the low frequencies, thereby allowing the low frequency noise to be filtered prior to pass band and does not appear in a frequency of interest. Also, the method includes shaping a pass band of the amplifier in a band pass filter stage.

DETAILED DESCRIPTION OF THE INVENTION

The invention involves an ultra-low-power neural recording amplifier. The amplifier appears to be the lowest power and most energy-efficient neural recording amplifier reported to date. Low-noise design techniques are used that help the neural amplifier achieve input-referred noise that is near the theoretical limit of any amplifier using a differential pair as an input stage.

Figure 1:
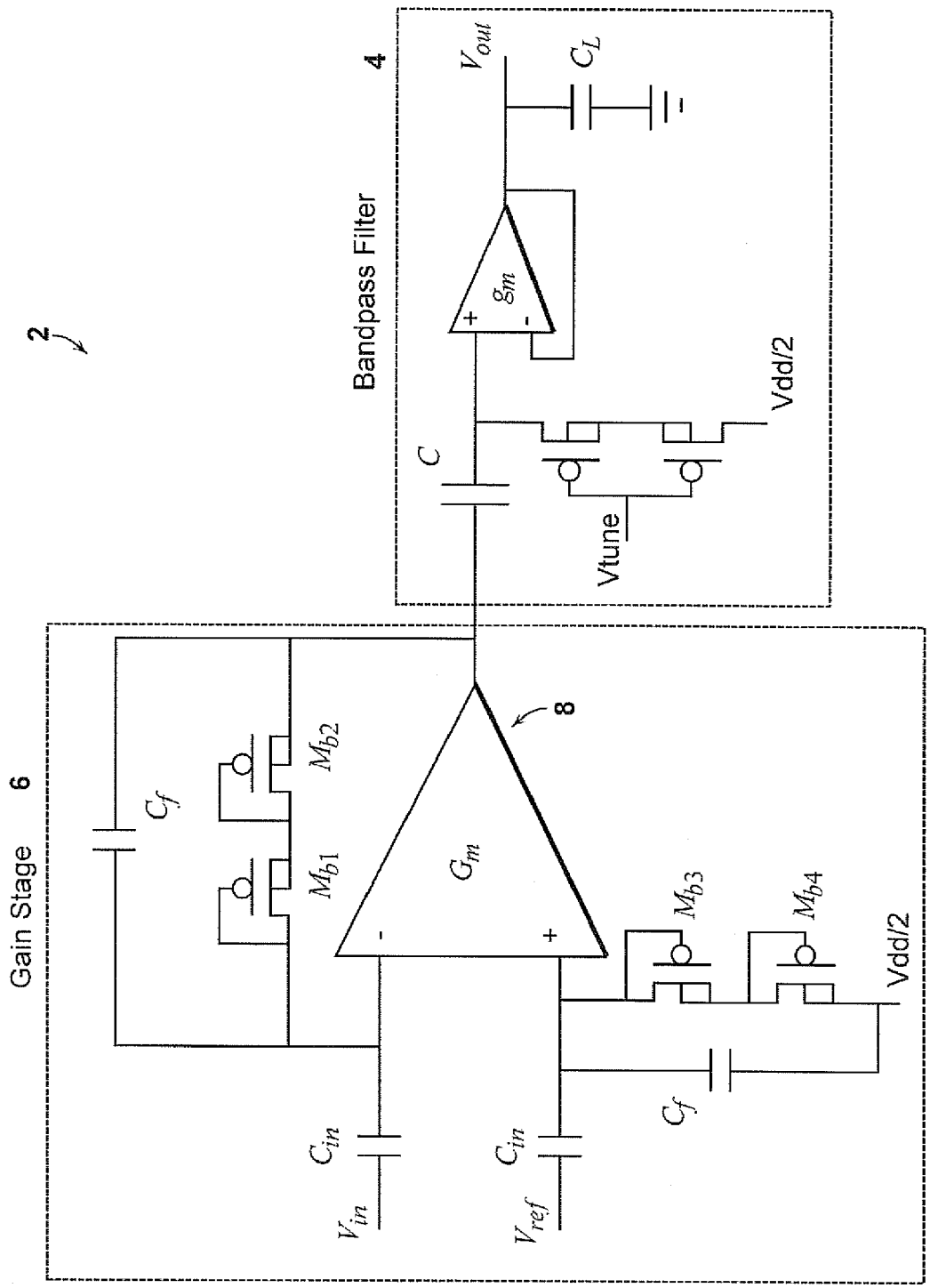
FIG. 1 is a schematic diagram of the inventive neural amplifier.

The overall schematic of a neural amplifier 2 is shown in FIG. 1. The neural amplifier 2 includes a bandpass filter stage following a gain stage 6 to shape the passband of the amplifier 2. The low-frequency high-pass cutoff of the gain stage 6 is created by the MOS-bipolar pseudoresistor element formed by $M_{b1}$-$M_{b2}$ and the capacitance $C_f$. The capacitive feedback formed by $C_f$ and $C_{in}$ sets the midband gain of the amplifier 2 to approximately 40.8 dB. The high-pass cutoff and the low-pass cutoff frequencies of the amplifier 2 can be adjusted via $V_{tune}$ and the bias current of the $g_m$-OTA in a bandpass-filter stage 4 respectively. With the addition of the bandpass-filter stage 4, the amplifier 2 can be configured to record either LFPs (<1 Hz to 100 Hz) or neural spikes (100 Hz to >1 kHz). The bandpass-filter stage 4 includes C and $C_L$ to filter low frequency noise.

For low-bandwidth LFP recording, the bias current of the gain stage OTA 8 can be lowered to conserve power. It is worth mentioning that the high-pass cutoff frequency of the gain stage 6 should be kept as low as possible. Weak-inversion MOS transistors ($M_{b3}$-$M_{b4}$) are placed in parallel with $C_f$ to create a high-pass filter with a cutoff frequency at a few hundred Hz introduces low-frequency noise that rolls off as $1/f^2$ in power units due to the noise from the transistor being low-pass filtered by $C_f$. This low-frequency noise appears at the front-end and gets amplified by the gain of the amplifier thereby degrading the minimum detectable signal. In the design, however, the MOS-bipolar pseudoresistor element's noise is at very low frequencies since the MOS-bipolar pseudoresistor element has much higher impedance than a weak-inversion MOS transistor. Therefore, low-frequency noise due to this element is filtered out well before the passband and does not appear in the frequency band of interest.

Figure 2:
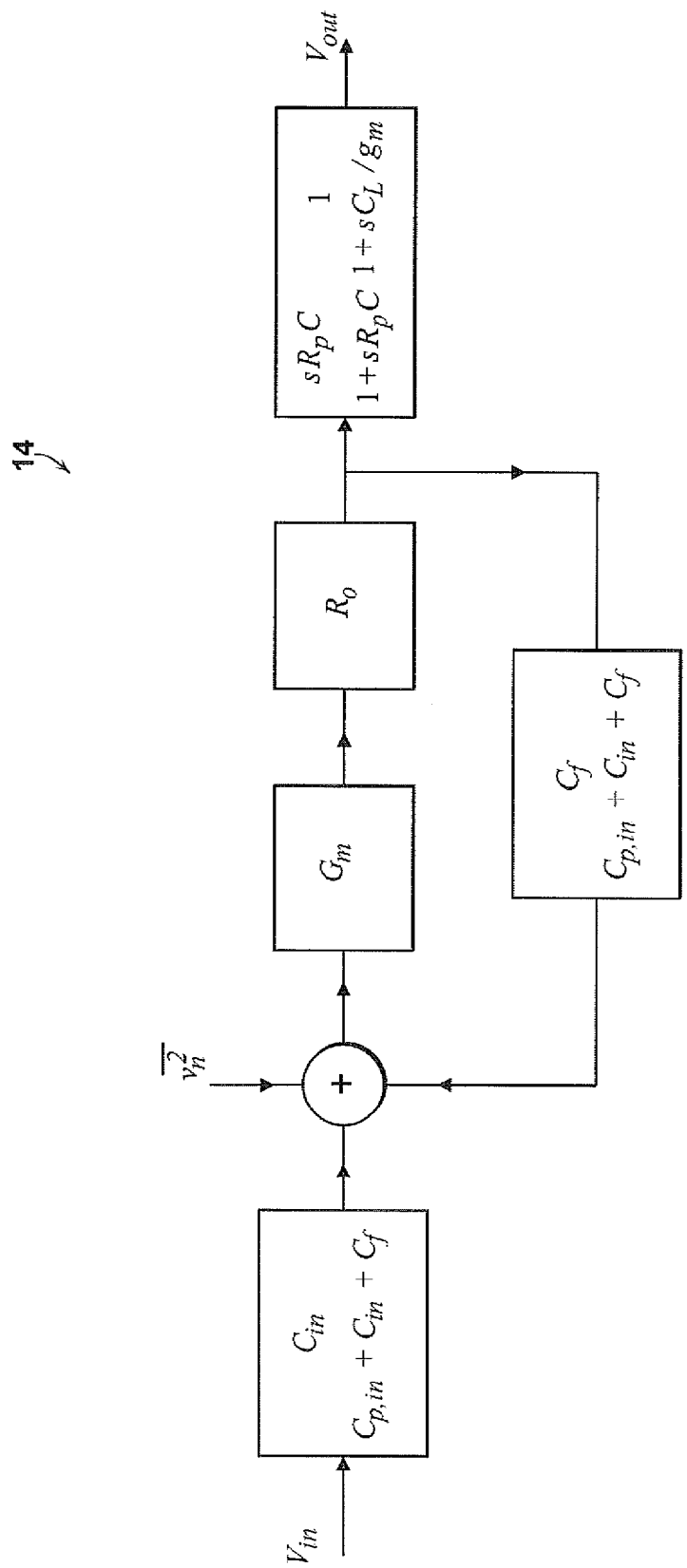
FIG. 2 is a block diagram illustrating the neural amplifier including the input noise source.

The operation of the inventive amplifier 2 can easily be understood by the block diagram 14 of FIG. 2. The capacitance $C_{p,in}$ is included to model parasitic gate capacitances at input terminals of the gain-stage OTA 8. The input referred-noise of the OTA 8 is modeled as a $v^2_n$ term added to the system at the input of the gain-stage OTA 8. The gain-stage OTA 8 is used as a high-gain amplifier and is modeled by $G_m$ and $R_O$ blocks where $G_m$ and $R_O$ represents the transconductance and the output resistance of the gain-stage OTA 8 respectively. In the bandpass-filter stage, $R_p$ is the resistance of the series PMOS transistors operating in the triode regime. The value of $R_p$ is set by $V_{tune}$. The combination of C and $R_p$ realizes the highpass cutoff frequency for the amplifier. From the small-signal block diagram in FIG. 2, assuming that $G_mR_O$ is much higher than 1, one can express the transfer function of the neural amplifier as $$H(s) = \frac{v_{out}(s)}{v_{in}(s)} = -\frac{C_{in}}{C_f} \cdot \frac{sR_pC}{1+sR_pC} \cdot \frac{1}{1+sg_mC_L}. \quad \text{Eq. 1}$$

The midband gain of the amplifier is $A_v = -C_{in}/C_f$. The highpass cutoff frequency is at $f_{HP} = 1/(2\pi R_p C)$ whereas the lowpass cutoff frequency is at $f_{LP} = g_m/(2\pi C_L)$. One can relate the input-referred noise $\overline{v^2_n}$ of the gain-stage OTA 8 to the input-referred noise $\overline{v^2_{n,amp}}$ of the overall amplifier as $$\overline{v^2_{n,amp}} = \left(\frac{C_{in}+C_f+C_{p,in}}{C_{in}}\right)^2 \cdot \overline{v^2_n}. \quad \text{Eq. 2}$$

The input-referred noise of the bandpass filter stage is insignificant and is not included in the block diagram since the gain of 40 dB of the gain stage alleviates the bandpass-filter stage's input-referred noise requirement. As a result, the power consumption of the bandpass filter stage 4 is much smaller than that of the gain stage 6.

Thus, to achieve low-noise performance, it is important to design the gain-stage OTA to have low input-referred noise.

Figure 3:
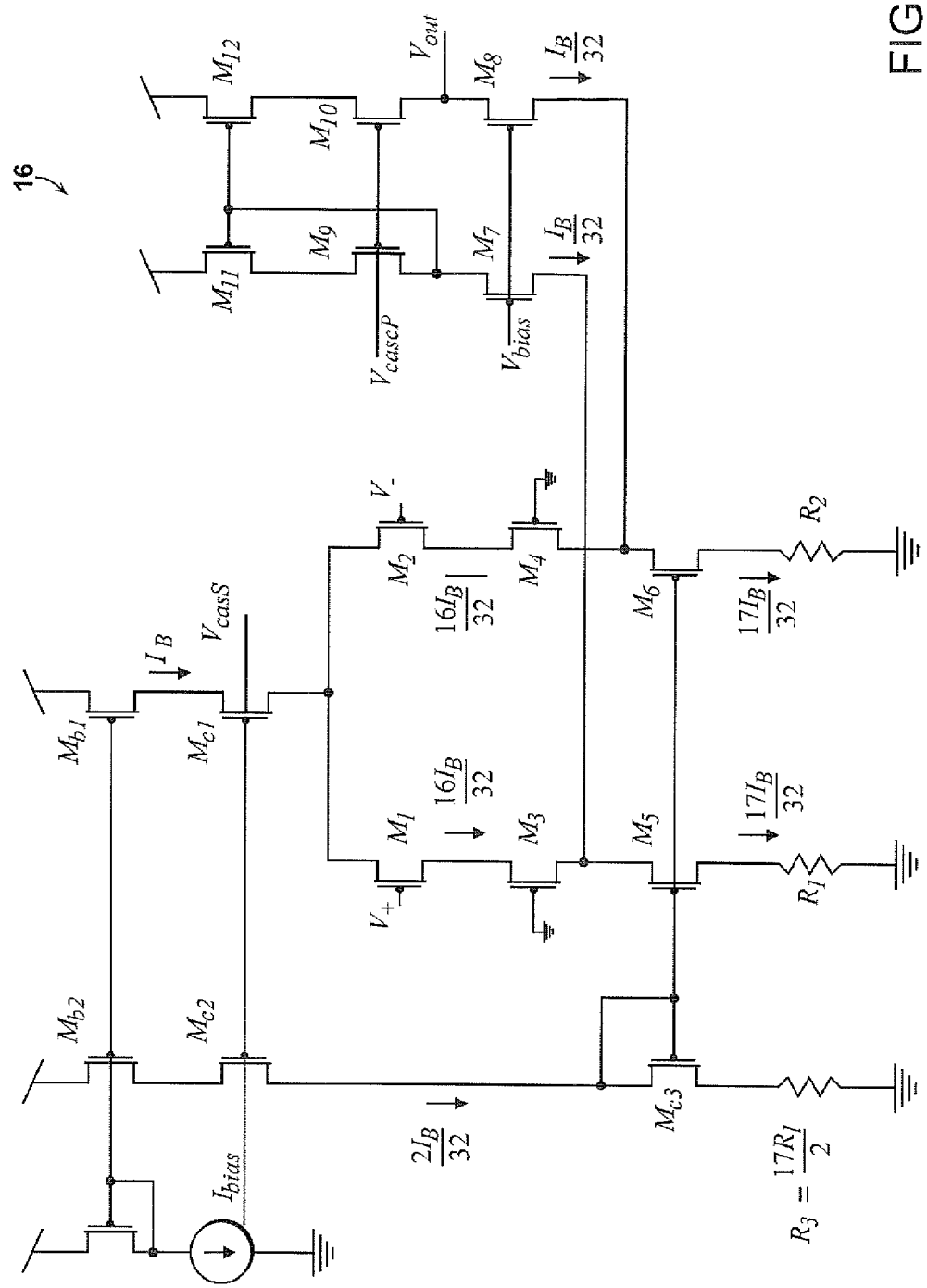
FIG. 3 is a schematic diagram illustrating a low-noise OTA used in accordance with the invention.

The schematic of the low-noise OTA 16 is shown in FIG. 3. It is a modified version of a standard folded-cascode topology. The OTA 16 in FIG. 3 is biased such that the currents of the transistors in the folded branch $M_7$-$M_{12}$ are only a small fraction of the current in the input differential pair transistors $M_1$ and $M_2$. In the invention, the channel current in $M_7$-$M_{12}$ is scaled to approximately $1/16^{th}$ of the current in $M_1$ and $M_2$. The much lower current in $M_7$-$M_{12}$ makes the noise contributed by them negligible compared to that from $M_1$ and $M_2$. As a result, one can simultaneously lower the total current and the total input-referred noise of the OTA 16.

To ensure that such severe current scaling is achieved, one can carefully set the bias currents of $M_5$ and $M_6$ through the use of the bias circuit formed by $M_{b2}$, $M_{c2}$, and $M_{c3}$. The current sources $M_{b1}$, $M_{b2}$ are cascoded to improve their output impedances and thereby ensure accurate current scaling. They operate in strong inversion to reduce the effect of threshold voltage variations. The source-degenerated current mirrors formed by $M_{c3}$, $M_5$ and $M_6$ and resistors $R_1$ and $R_2$ set the currents in $M_5$ and $M_6$ such that the currents in $M_7$ and $M_8$ (the difference between the current in $M_3$ and $M_5$ and between the current in $M_4$ and $M_6$) are a small fraction of the currents in $M_1$ and $M_2$.

Figure 4:
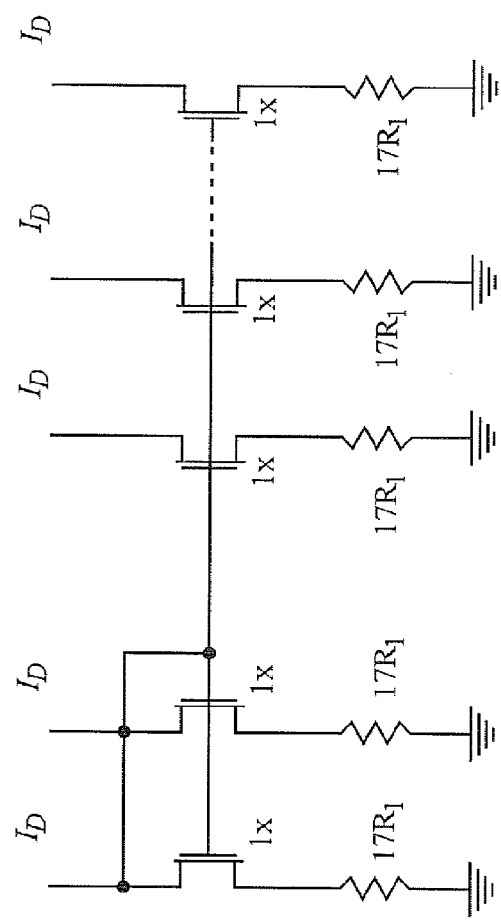
FIG. 4 is a circuit schematic for analyzing current scaling in the source-degenerated current mirrors.
Figure 4:
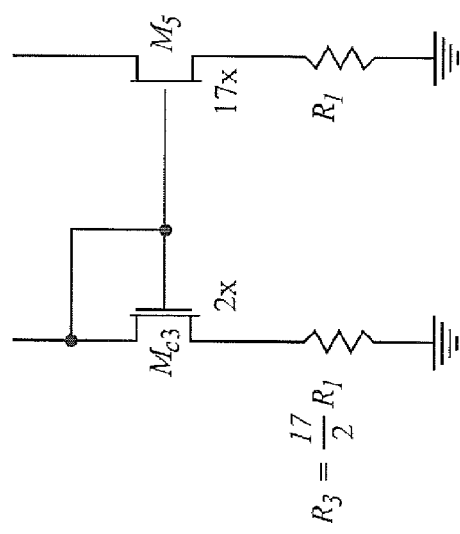

In order to save power in the bias circuit, the current scaling ratio between $M_{b1}$ and $M_{b2}$ is 16:1 ($2I_B/32$) as shown in FIG. 3. To set the currents in the folded-branch transistors to be ($I_B/32$), which is $1/16^{th}$ of the currents in differential-pair transistors, one can set the current in $M_5$ and $M_6$ to be ($17I_B/32$). Such current ratioing is achieved by making $R_3$ to be $17R_1/2=17R_2/2$, and constructing $M_{c3}$ as a parallel combination of two unit transistors while $M_5$ and $M_6$ are each constructed from 17 unit transistors in parallel. To clarify this scaling further, the current mirror formed by $M_{c3}$, $R_3$, and $M_5$, $R_1$ in FIG. 3 is transformed into an equivalent circuit comprised of many source-degenerated unit transistors 18 as shown in FIG. 4. All source-degenerated unit transistors are identical and have the same gate voltage. For any gate voltage there is only one source voltage at which a unit resistor's current equals a unit transistor's current. Thus, the nominal channel currents in all unit transistors are identical and the total current in $M_5$ is 17/2 times the current in $M_{c3}$ as desired.

For the amplifier to have low input-referred noise, the transconductance $G_m$ of the OTA needs to be maximal for a given current level. For the standard folded-cascode OTA 20 shown in FIG. 5, the impedance looking into the sources of $M_5$ and $M_6$ is much smaller than the impedance looking into the drains of $M_1$-$M_4$. As a result, the standard folded-cascode OTA 20 achieves an overall transconductance $G_m$ near $g_m$, the $g_m$ of $M_1$. However, if one lowers the current in $M_5$-$M_{10}$ to be a small fraction of the current in $M_1$ and $M_2$, the impedance looking into the sources of $M_5$ and $M_6$ can be a significant portion of the impedance looking into the drains of $M_1$-$M_4$ such that incremental currents do not almost all go through the sources of $M_5$ and $M_6$ in the current divider formed between the sources of $M_5$ and the drains of $M_1$ and $M_3$. Therefore, $G_m$ is significantly less than $g_{m1}$.

Figure 5:
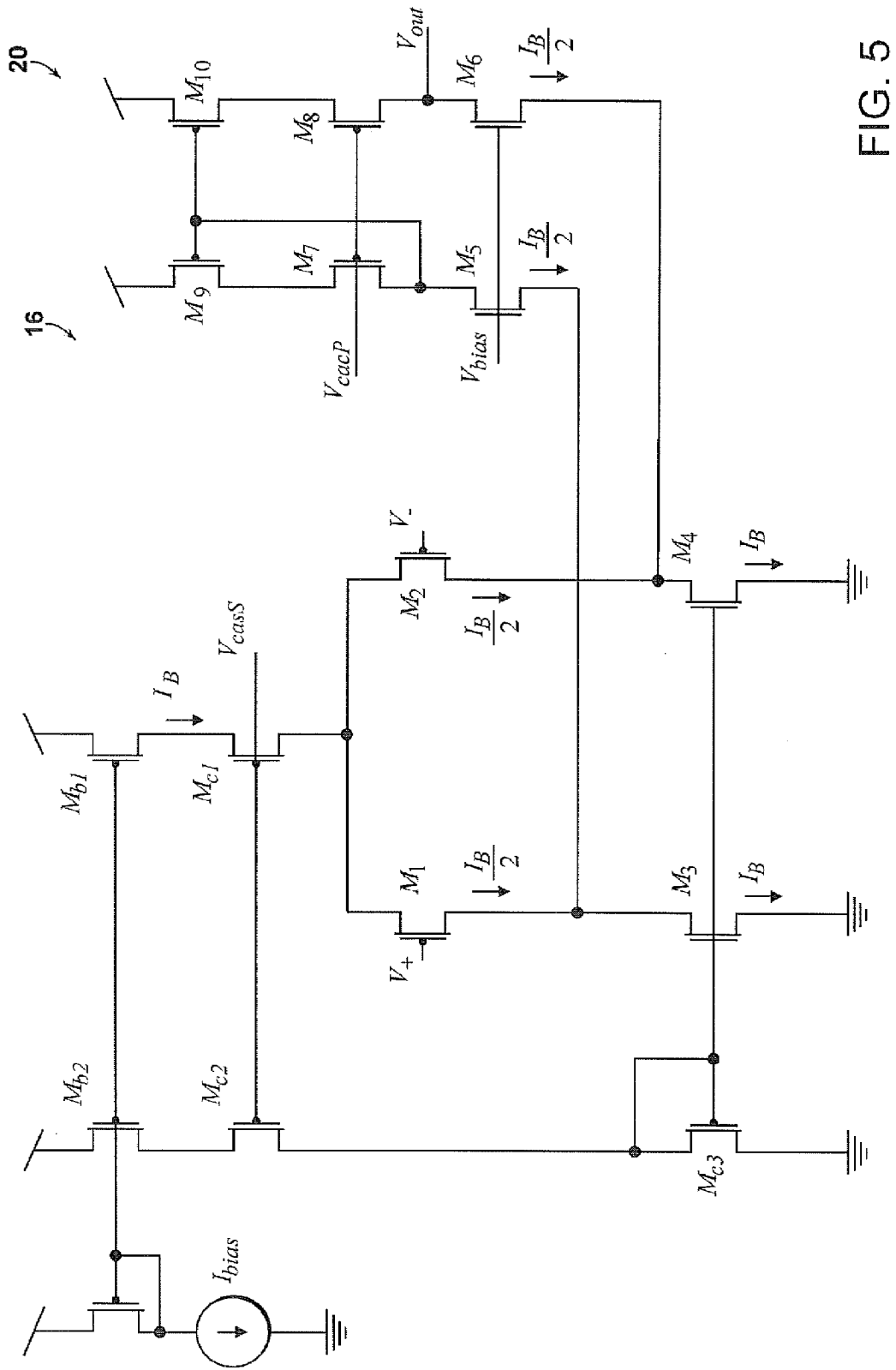
FIG. 5 is a circuit schematic illustrating a standard folded-cascode OTA used in accordance with the invention.

In the standard folded-cascode topology 20 shown in FIG. 5, the current sources formed by $M_3$ and $M_4$ contribute a significant amount of noise due to their large channel currents. In the design, one can replace the current-source transistors $M_3$ and $M_4$ in FIG. 5 with source-degenerated current sources formed by $M_5$ and $M_6$ and degeneration resistors $R_1$ and $R_2$ as shown in FIG. 3. With an appropriate choice of degeneration resistance, the noise contributions from the source-degenerated current sources are mainly from the resistors and can be made much smaller than the noise contributions from MOS transistors operating at the same current level. Another benefit of using source-degenerated current sources is that the noise from resistors is mainly thermal noise while NMOS current sources contribute a large amount of 1/f noise unless they are made with very large area. As a result, the 1/f noise in the neural amplifier is mainly from the input differential pair. Therefore, the input-differential pair is made with large-area PMOS transistors, which have lower 1/f noise than similarly-sized NMOS transistors in most CMOS processes.

To achieve low input-referred noise, it is important that the transconductance of the OTA 20 be maximized for a given total current. The maximum transconductance of the standard folded-cascode OTA 20 that can be achieved is the transconductance of one of the transistors in the input-differential pair, say $g_{m1}$. As a result, it is advantageous to operate $M_1$ and $M_2$ in the subthreshold regime where a transistor's $g_m$ is maximized for a given current level. Therefore, $M_1$ and $M_2$ need to have large W/L ratios. The lengths of $M_1$ and $M_2$ then need to be small such that their widths stay relatively small and the input capacitance of the amplifier is not too large.

In order to make sure that all the incremental current caused by the differential input goes through the sources of $M_7$ and $M_8$, the input differential-pair transistors is cascaded with $M_3$ and $M_4$ to increase their output impedances. The source-degenerated current sources formed by $M_5$ and $R_1$ and by $M_6$ and $R_2$ are designed to have large output impedances as well. The output impedances of the cascoded input-differential pair and the source-degenerated current sources need to be much larger than the impedance looking into the sources of $M_7$ and $M_8$ such that $G_m$ is near $g_{m1}$.

Figure 6A:
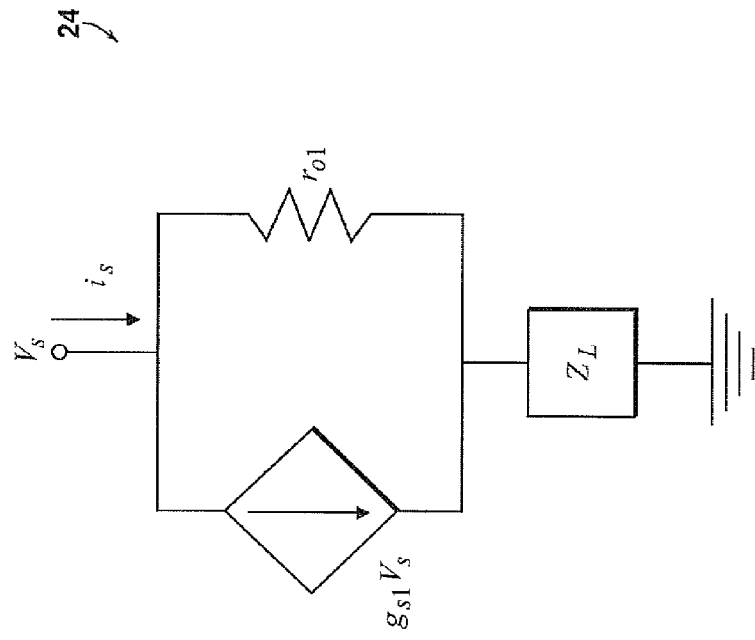
FIGS. 6A-6B are circuit schematics for obtaining admittance formulas in accordance with the invention.
Figure 6A:
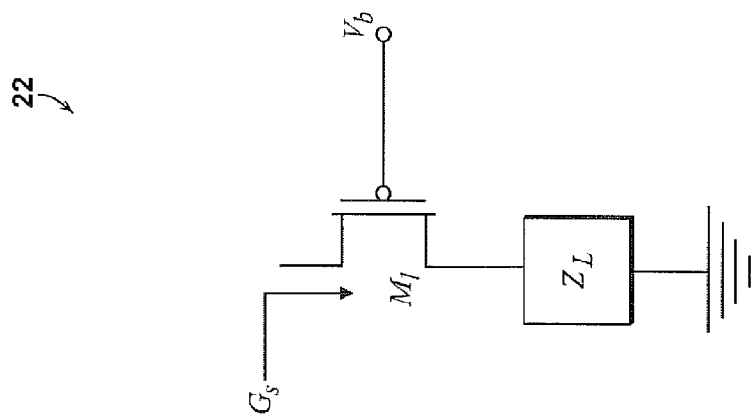
Figure 6B:
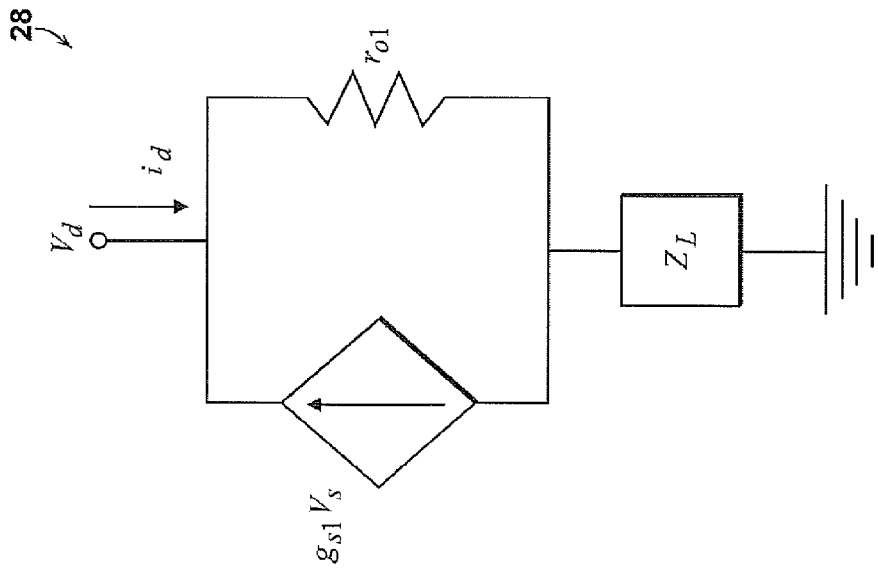
Figure 6B:
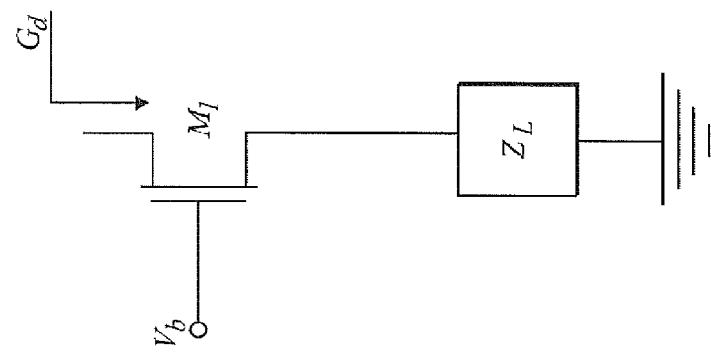

Before the operation of the OTA 16 in FIG. 3 is analyzed, a brief review of two useful admittance formulas is needed. FIG. 6A shows the circuit 22 and small signal circuit 24 illustrating the admittance looking into the source of an MOS transistor when its drain is connected to an impedance to incremental ground. FIG. 6B shows the circuit 26 and small signal circuit 28 illustrating the admittance looking into the drain of a cascode transistor. Using a nodal analysis, one obtains the two admittances to be $$G_s = \frac{i_d}{v_s} = \frac{g_{s1} + 1/r_{o1}}{1 + Z_L/r_{o1}}, \quad \text{Eq. 3}$$

$$G_d = \frac{i_d}{v_d} = \frac{1}{r_{o1}} \cdot \left( \frac{1}{1 + g_{s1} Z_L + Z_L/r_{o1}} \right) \quad \text{Eq. 4}$$

Let $G_{s3}$ be the admittance looking into the sources of $M_3$ and $M_4$, $G_{d5}$ be the admittance looking into the drains of $M_5$ and $M_6$, and $G_{s7}$ be the admittance looking into the sources of $M_7$ and $M_8$ of the OTA 16 in FIG. 3. One can express the transconductance $G_m$ of the OTA 16 as $$G_m = g_{m1} \cdot \left( \frac{G_{s7}}{G_{s7} + G_{d5}} \right) \left( \frac{G_{s3} r_{o1}}{1 + G_{s3} r_{o1}} \right). \quad \text{Eq. 5}$$

One can express $G_{s3}$, $G_{s7}$ and $G_{d5}$ by using Eqs. 3 and 4 as $$G_{s3} = \frac{g_{s3} + 1/r_{o3}}{1 + 1/(r_{o3}(G_{s7} + G_{d5}))} \approx \frac{g_{s3}}{1 + 1/(r_{o3}(G_{s7} + G_{d5}))}, \quad \text{Eq. 6}$$

$$G_{s7} = \frac{g_{s7} + 1/r_{o7}}{1 + (1/g_{m11})/r_{o7}} \approx \left( \frac{g_{m11} r_{o7}}{1 + g_{m11} r_{o7}} \right) \cdot g_{s7}, \quad \text{Eq. 7}$$

and $$G_{d5} = \frac{1}{r_{o5}} \frac{1}{1 + R_1/r_{o5} + g_{s5} R_1} \quad \text{Eq. 8}$$

where $g_{si}$ and $r_{oi}$ are the incremental source admittance of $M_i$ with its drain at incremental ground, and the output resistance of $M_i$ respectively. The expressions from Eqs. 6-8 present the design constraints for sizing and biasing each device to achieve $G_m$ close to $g_{m1}$. The size, the channel current and the simulated intrinsic gain ($g_s r_o$) of each transistor in the OTA 16 can be easily be computed. From Eq. 5, in order to make $G_m$ close to $g_{m1}$, the ratios $G_{s7}/(G_{s7}+G_{d5})$ and $G_{s3ro1}/(1+G_{s3ro1})$ should be made as close to 1 as possible. The ratio $G_{s7}/(G_{s7}+G_{d5})$ represents the incremental current gain from the drain of $M_3$ and $M_4$ to the output. The incremental current gain from the input differential pair transistors to the drain of the cascode transistors $M_3$ and $M_4$ is $G_{s3ro1}/(1+G_{s3ro1})$.

In order to maximize the ratio $G_{s7}/(G_{s7}+G_{d5})$, one can try to make $G_{d5} \ll G_{s7}$. Since $M_{11}$ and $M_7$ have the same channel current, $g_{m11} \approx g_{m7}$. Therefore, $g_{m11} r_{o7} \approx g_{m7} r_{o7} \gg 1$ and one can have $G_{s7} \approx g_{s7}$. In order to make $G_{d5} \ll G_{s7}$, one needs to minimize $G_{d5}$. From Eq. 8, one can minimize $G_{d5}$ by making $r_{o5}$ large and also making $g_{s5} R_1 \gg 1$. Therefore, one can make $M_5$ and $M_6$ with large W/L ratios and with long channel lengths to achieve large $g_{s5}$ and $r_{o5}$ respectively. Then one can choose $R_1$ such that $g_{s5} R_1 \gg 1$.

In order to maximize the ratio $G_{s3ro1}/(1+G_{s3ro1})$, one needs to make $G_{s3ro1} \gg 1$. From Eq. 6, $G_{s3}$ is approximately $g_{s3}$ if $G_{s7ro3}$ is much greater than 1. Since $G_{s7} \approx g_{s7}$, one can have $G_{s7ro3} \approx g_{s7ro3}$. Since the current in $M_7$ is about 1/16 of the current in $M_3$ and both transistors are operating in subthreshold, $g_{s7} \approx g_{s3}/16$. From simulation, one can achieve $g_{s3ro3}$ of 119 which results in a $g_{s7ro3}$ of 7.43. The expression in Eq. 6 is thus reduced to $G_{s3} \approx 0.88 g_{s3}$. Note that $M_1$ and $M_3$ have the same currents and the same channel lengths. Thus $M_1$ and $M_3$ should have $r_{o1} = r_{o3}$. As a result, $G_{s3ro1} \approx G_{s3ro3} \approx (0.88983) r_{o3} = 104$. Therefore, the ratio $G_{s3ro1}/(1+G_{s3ro1})$ is close to 1. As a result, one is able to achieve $G_m$ close to $g_{m1}$ even with sixteen-fold current scaling between the input differential-pair transistors and the folded-branch transistors.

The noise in cascode transistors typically contributes little to the overall noise in an OTA 16 because these transistors self shunt their own current noise sources: A cascode transistor's current noise is attenuated by a factor of $1/(1+g_s R)^2$ where $g_s$ is its incremental source transconductance and R is the effective source-degeneration resistance respectively. Therefore, the only noise sources that are significant in FIG. 3 are due to non-cascode transistors, i.e., the differential-pair input transistors $M_1$ and $M_2$, the resistors $R_1$ and $R_2$, and the current-mirror transistors $M_{11}$ and $M_{12}$. One can now perform an OTA noise analysis.

The admittances looking into the sources of $M_3$, $M_5$, and $M_7$ are approximately $g_{s3}$, $g_{s5}$, and $g_{s7}$ respectively. Then the current transfer function from each significant current noise source in the OTA to an incrementally grounded output can be calculated to be $$\frac{\overline{i^2_{n,out}}}{\overline{i^2_{n,M1}}} = \left( \frac{G_{s3ro1}}{1+G_{s3ro1}} \cdot \frac{G_{s7}}{G_{s7}+G_{d5}} \right)^2 \approx \left( \frac{g_{s3ro1}}{1+g_{s3ro1}} \cdot \frac{G_{s7}}{g_{s7}+G_{d5}} \right)^2,$$  Eq. 9

$$\frac{\overline{i^2_{n,out}}}{\overline{i^2_{n,R1}}} = \left( \frac{G_{s5} R_1}{1+G_{s5} R_1} \cdot \frac{G_{s7}}{G_{s7}+G_{d3}} \right)^2 \approx \left( \frac{g_{s5} R_1}{1+g_{s5} R_1} \cdot \frac{g_{s7}}{g_{s7}+G_{d3}} \right)^2,$$  Eq. 10 and $$\frac{\overline{i^2_{n,out}}}{\overline{i^2_{n,M11}}} = 1$$  Eq. 11

Since the inventive circuit is biased such that $g_{s3ro1} \gg 1$, $g_{s5} R_1 \gg 1$ and $g_{s7} \gg G_{d5}$, $G_{d3}$ as explained herein, the expressions from Eqs. 9-11 are reduced to 1. For the following discussion, the MOSFET's current noise is modeled as $$\overline{i^2_n} = 4\gamma k T g_m$$  Eq. 12 where k is Boltzmann's constant, T is the absolute temperature, $g_m$ is the transconductance of the MOSFET, and $\gamma = 2/3$ for above-threshold operation and $\gamma = 1/(2\kappa)$ for subthreshold operation. From this noise model, one can calculate the input-referred noise of the OTA 16 as the total output current noise divided by its transconductance $g^2_{m1}$ to be $$\overline{v^2_n} = \frac{1}{g^2_{m1}} \left( \frac{4 k T g_{m1}}{\kappa} + \frac{8 k T}{R_1} + \frac{16}{3} k T g_{m11} \right)$$  Eq. 13 where $M_1$ and $M_2$ operate in weak inversion and $M_{11}$ and $M_{12}$ operate in strong inversion. Let IC be the inversion coefficient of the transistor which is defined as the ratio of its channel current $I_D$ to the moderate inversion characteristic current $I_S$ where $I_S$ is given by $$I_S = \frac{2 \mu C_{ox} U_T^2}{\kappa} \cdot \frac{W}{L}$$  Eq. 14 where $U_T$ is the thermal voltage and is equal to kT/q, where q is the electron charge. Using the EKV model, one can estimate the $g_m$ of each transistor to be $$g_m = \frac{\kappa I_D}{U_T} \cdot \frac{2}{1 + \sqrt{1 + 4 \cdot IC}}.$$  Eq. 15

One can rewrite Eq. 13 as $$\overline{v^2_n} = \frac{1}{g_{m1}} \cdot \frac{4 k T}{\kappa} \left( 1 + \frac{2 U_T}{I_1 R_1} + \frac{4}{3} \kappa \alpha \frac{I_{11}}{I_1} \right)$$  Eq. 16 where $\alpha = 2/1 + \sqrt{1 + 4 \cdot IC_{11}}$, which is less than 1, and $IC_{11}$ is the inversion coefficient of $M_{11}$ and $M_{12}$. Eq. 16 suggests that in order to minimize the input-referred noise of the OTA, $I_1 R_1$ should be large compared to $2 U_T$. Furthermore, the current ratio $I_1/I_{11}$ should be large compared to $4/3\kappa\alpha$. For the implementation, the ratio $I_1/I_{11}$ is 16. For a total supply current of 2.7 μA and 5.3 kHz bandwidth, $I_1$ and $I_{11}$ are approximately 1.18 μA and 68 nA respectively. For R1=240 kΩ, the second and the third terms in Eq. 16 are $1.8 \times 10^{-1}$ and $5.4 \times 10^{-2}$ respectively, assuming a temperature of T=300 K, $\kappa=0.7$ and $\alpha=1$. Equivalently, Eq. 13 is reduced to $$\overline{v^2_n} = \frac{2 k T}{\kappa g_{m1}} \times 2.47$$  Eq. 17

Eq. 17 can be interpreted as 2.47 times the input-referred noise of a MOS transistor operating in weak inversion with a transconductance of $g_{m1}$. This means that the OTA effectively has only 2.47 subthreshold devices that contribute noise. This value is close to the theoretical limit of 2 noise sources in any OTA that uses two subthreshold MOS differential-pair transistors as an input stage. Effectively, the design has minimized almost all other sources of noise except for that of $M_1$ and $M_2$.

The key techniques for achieving good power-noise tradeoff in the amplifier are the uses of source-degenerated current mirrors and the severe current scaling ratio between the input-differential pair transistors and the folded-branch transistors. The severe current scaling scheme can work only if the current errors due to mirroring are well controlled: The amplifier would not work if the error due to current scaling is too large such that none of the current flows in $M_7$-$M_{12}$ in the OTA of FIG. 3. Thus, one can address and investigate this concern to ensure the correct operation of the amplifier.

Now consider the current matching between two unit transistors in FIG. 4 due to variations in the threshold voltage and variations in the source-degeneration resistance. These variations are modeled as errors in the parameters of each of the unit transistors of FIG. 4. Let the nominal current in one of the unit transistors of $M_{c3}$ be $I_D$ and consider the deviation in current $\Delta I_D$ in one of the unit transistors of $M_5$ from its nominal value due to deviations in the threshold voltage $\Delta V_T$ and deviations in the source-degeneration resistor $\Delta R$ as shown in circuit diagram 30 of FIG. 7A. To model the threshold-voltage mismatch, one can use the body-referenced current equation in saturation for an MOS transistor operating in weak inversion. Let the nominal current in each unit transistor be described by $$I_D = I_s e^{\kappa(V_{GS}-V_T)/U_T} \cdot e^{((1-\kappa)V_{BS}/U_T)}. \qquad \text{Eq. 18}$$

where $I_s$ is a constant scaling current which is the same for all unit transistors. Let V be the nominal DC voltage drop across R such that $I_D=V/R$. One can define $$g_T = \frac{\partial I_D}{\partial V_T} = -\frac{\kappa}{U_T} \cdot I_D = -g_m, \qquad \text{Eq. 19}$$

$$g_R = \frac{\partial I_D}{\partial R} = \frac{\partial}{\partial R}\left(\frac{V}{R}\right) = -\frac{1}{R} \cdot \frac{V}{R} = -\frac{I}{R} \cdot I_D \qquad \text{Eq. 20}$$

and $$g_{mb} = \frac{\partial I_D}{\partial V_{BS}} = \frac{1-\kappa}{U_T} \cdot I_D. \qquad \text{Eq. 21}$$

Figures 7A, 7B:
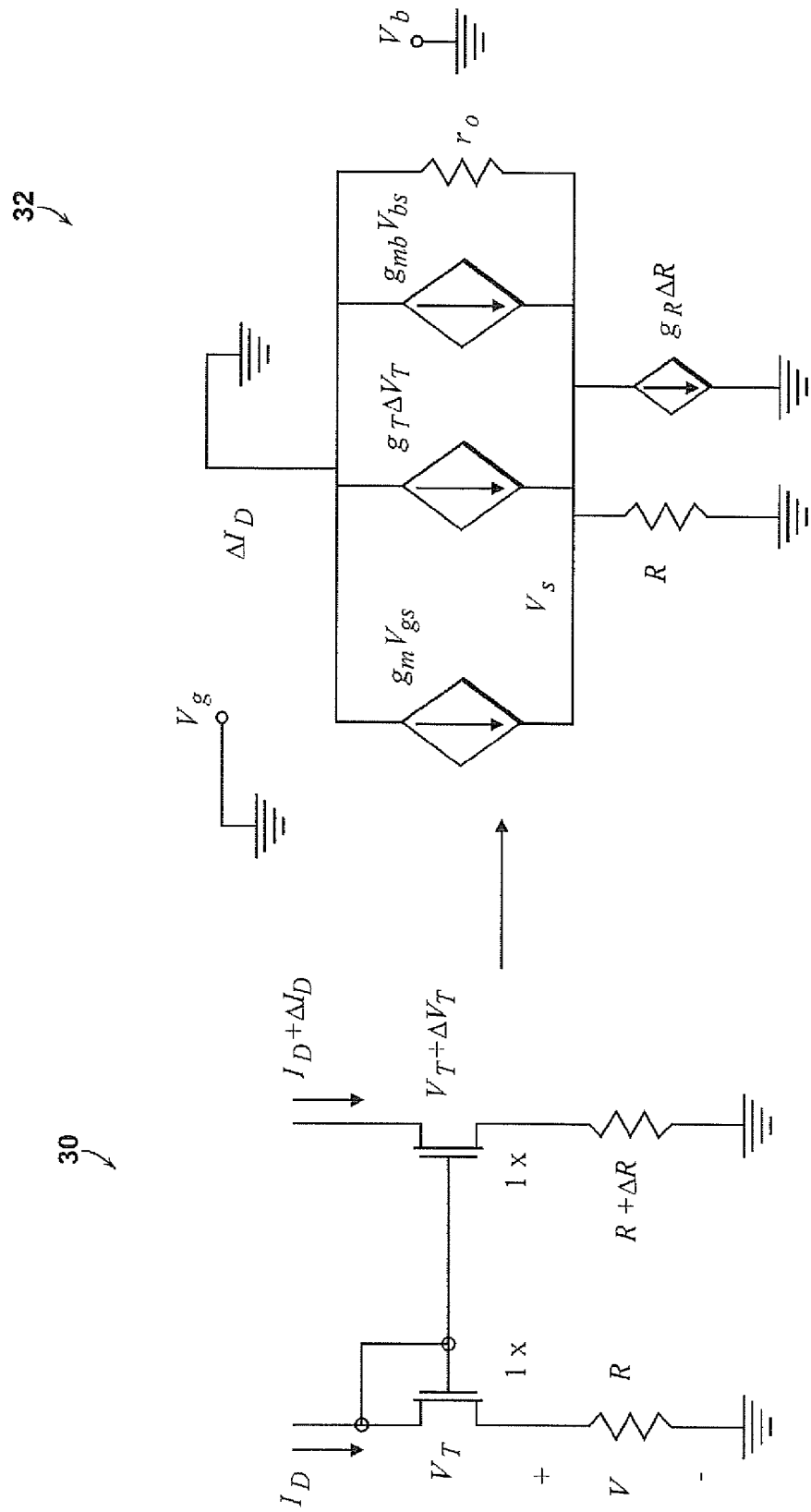
FIGS. 7A-7B are circuit schematics for analyzing mismatches in source-degenerated current mirrors used in accordance with the invention.

By assuming that $\Delta V_T$ and $\Delta R$ are small, one can use a small-signal circuit model 32 as shown in FIG. 7B to calculate the variation in nominal current $\Delta I_D$ when $\Delta V_T$ and $\Delta R$ are considered as inputs to the system. With some analysis, the variation in the channel current due to variations in $V_T$ and R is obtained to be $$\Delta I_D = g_T \cdot \Delta V_T - (g_m + g_{mb} + 1/r_o) \cdot (\Delta I_D - g_R \cdot \Delta R) \cdot R. \qquad \text{Eq. 22}$$

Combining Eq. 22 with the results from Eqs. 19 and 20 and using the relationship $g_s = g_m + g_{mb}$, one can obtain the fractional change in channel current as a function of the fractional change in $V_T$ and R to be $$\frac{\Delta I_D}{I_D} = -\frac{1}{1+g_s R + R/r_o} \cdot \frac{\Delta V}{I_D/g_m} - \frac{g_s R + R/r_o}{1+g_s R + R/r_o} \cdot \frac{\Delta R}{R}. \qquad \text{Eq. 23}$$

Since $M_{c3}$, $M_5$ and $M_6$ are biased in weak-inversion regime, their $I_D/g_m$ is approximately 40 mV at room temperature. As seen from (23), the mismatch in threshold voltage as a fraction of 40 mV is attenuated by a factor of $1+g_s R+R/r_o$ and is negligible if $g_s R \gg 1$. In the design, one can have $g_s R \approx 12$, thus, the fractional mismatch in threshold voltage is attenuated by more than a factor of 10 and does not play a significant role in current mirror mismatch. In contrast, the fractional mismatch in channel current scales almost 1:1 to the fractional mismatch in R. However, the matching of passive components in most CMOS processes is much better controlled than the matching of transistors' threshold voltages. In the design, therefore, one can try to achieve good resistor matching with careful layout.

To compare the power-noise tradeoff among amplifiers, one can adopt the noise efficiency factor (NEF) proposed in and widely used to compare neural-amplifier designs:

$$NEF = V_{ni,rms} \sqrt{\frac{2 I_{tot}}{\pi \cdot U_T \cdot 4kt \cdot BW}} \qquad \text{Eq. 24}$$

where $V_{ni,rms}$ is the total input-referred noise, $I_{tot}$ is the total supply current, and BW is the −3 dB bandwidth of the amplifier respectively. The theoretical limit of the NEF of an OTA that uses a differential pair as an input stage is when the two differential-pair transistors are the only noise sources in the circuit. The input-referred noise of the OTA is then V2 ni=2× 2kT/(κg$_m$)=4kT/(κg$_m$) where g$_m$ is the transconductance of a single differential-pair transistor. For minimum input-referred noise, the transistors should run in subthreshold, such that $g_m = \kappa I_D/U_T$. Assuming a first-order roll-off of the frequency response, the input-referred noise of the ideal OTA is expressed as $$V_{ni,rms} = \sqrt{\frac{4kt \cdot U_T}{\kappa^2 I_D} \cdot \frac{\pi}{2} \cdot BW}$$

Combining Eqs. 24 and 25 and setting $I_{tot}=2I_D$, one can obtain the theoretical limit for NEF of any OTA that uses a subthreshold MOS differential pair to be $$NEF = \frac{\sqrt{2}}{\kappa} \approx 2.02$$

assuming a typical value of κ=0.7. The experimental NEF is near this value, and the theoretical NEF was computed to be 2.47.

Figure 8:
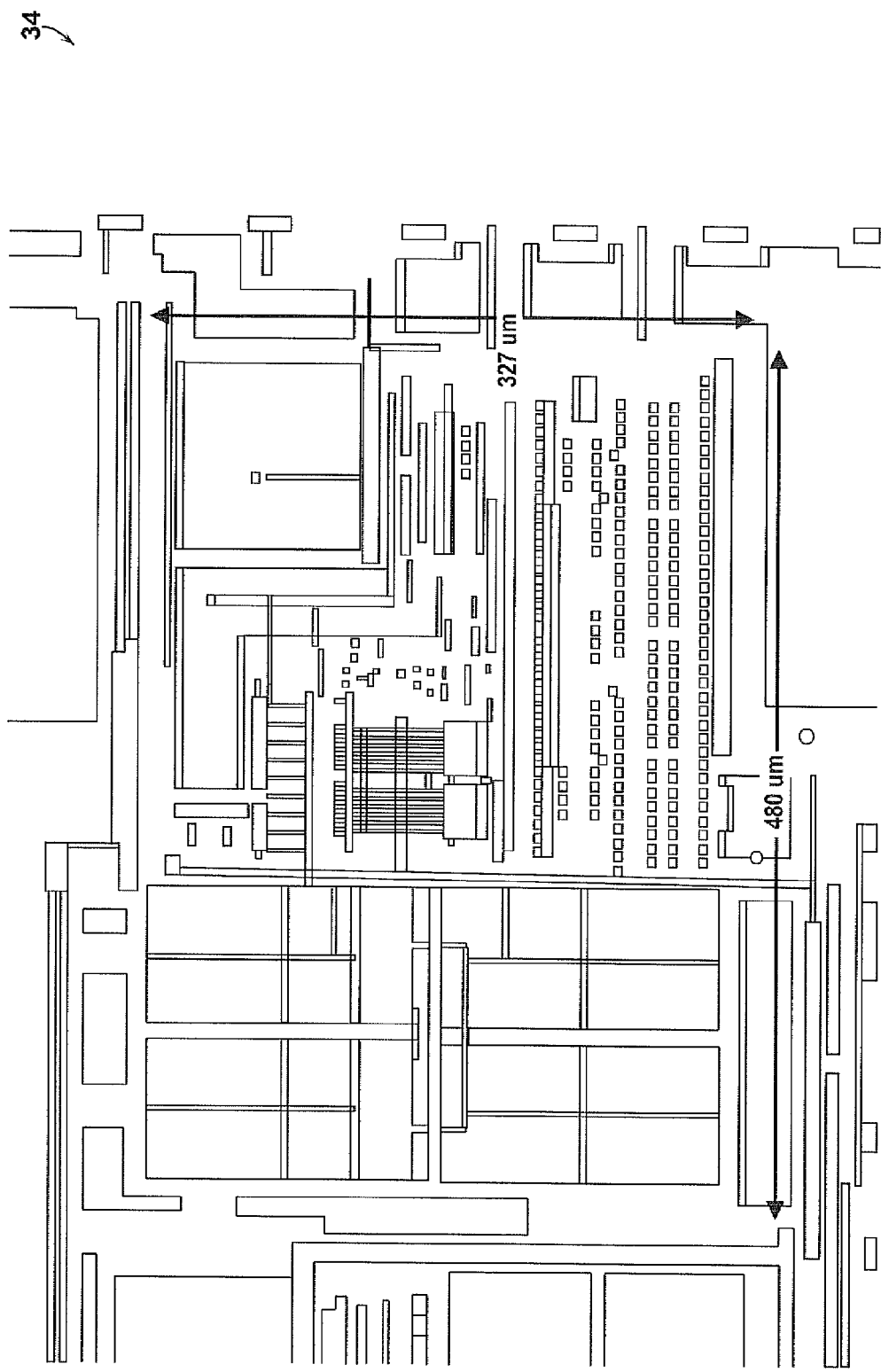
FIG. 8 is a die micrograph of the inventive neural amplifier.

The inventive amplifier was fabricated in a 0.5 μm CMOS process through the AMI foundry. It was designed to give a gain of approximately 110 (40.8 dB) by setting the value of $C_{in}$ to 14 pF and $C_f$ to 120 fF. The OTA in the bandpass filter stage is a wide common-mode range OTA to reduce signal distortion in the case of large input amplitudes. The amplifier occupies a chip area of 0.16 mm². A chip micrograph of the amplifier 34 is shown in FIG. 8.

Figure 9A:
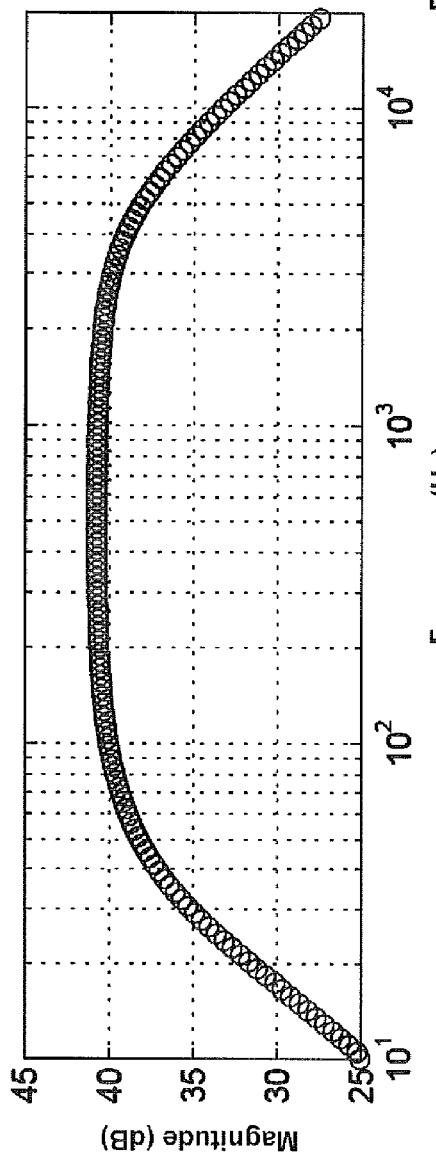
FIGS. 9A-9B are graphs illustrating the transfer function of the neural amplifier configured for recording neural spikes.
Figure 9B:
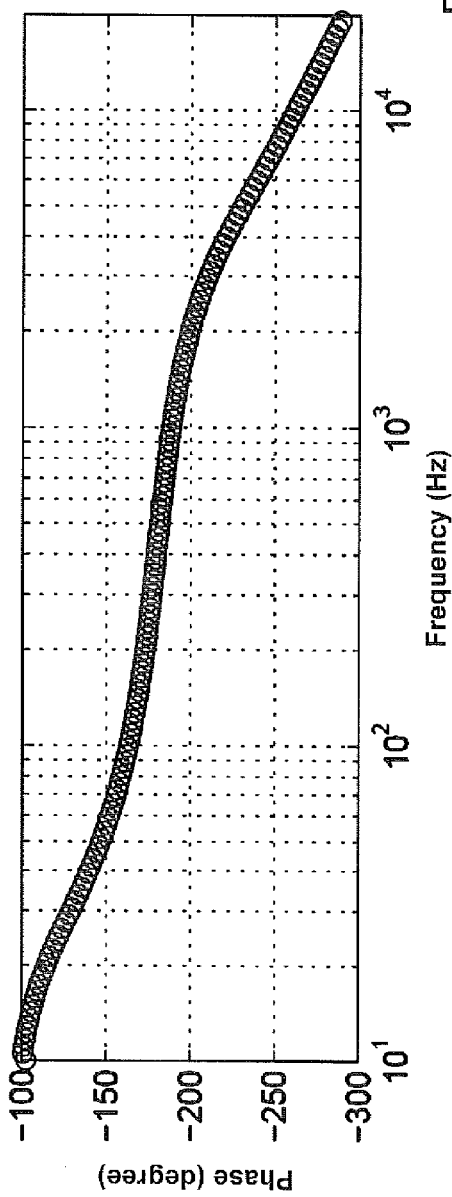

Four chips were tested on the lab bench and they exhibited very similar performance characteristics, indicating that the severe current-scaling scheme worked robustly. The measured transfer function of one of the neural amplifiers is shown in FIGS. 9A-9B. The amplifier consumes 2.7 μA including the current from the bias circuit ($M_{b2}$, $M_{c2}$ and $M_{c3}$)

from a 2.8 V supply. The current $I_{bias}$ shown in FIG. 3 is not included, since it can be shared by many amplifiers in the array. The −3 dB cutoff frequencies are adjusted to be at 45 Hz and 5.32 kHz. The amplifier is configured as an inverting amplifier, thus the phase is approximately −180° near the midband frequency.

Figure 10:
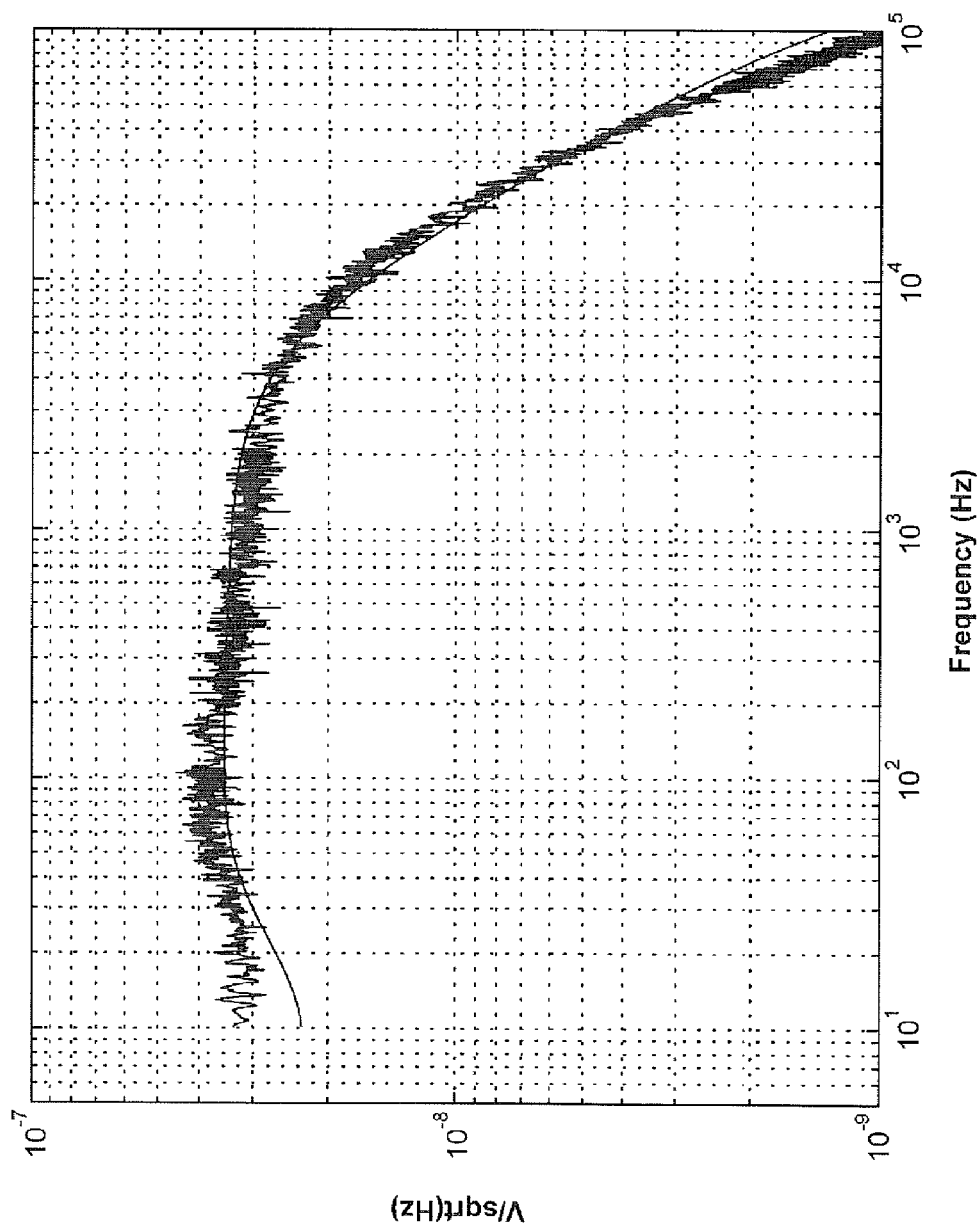
FIG. 10 is a graph illustrating measured and simulated input-referred noise spectra of the neural amplifier configured for recording neural spikes.

FIG. 10 shows the measured input-referred noise spectrum together with a circuit simulation of the noise spectrum with a similar noise model to the theoretical calculations (the smooth curve). There is good agreement between the measured and simulated curves. The measured thermal noise level is 31 nV/Hz. Integrating under the area of the measured curve from 10 Hz to 98 kHz yields a total input-referred noise of 3.06 $\mu V_{rms}$, while the simulated result is 3.1 $\mu V_{rms}$. With a high-pass cutoff frequency at 45 Hz, 1/f noise is filtered out and is not noticeable in the passband.

Figure 11:
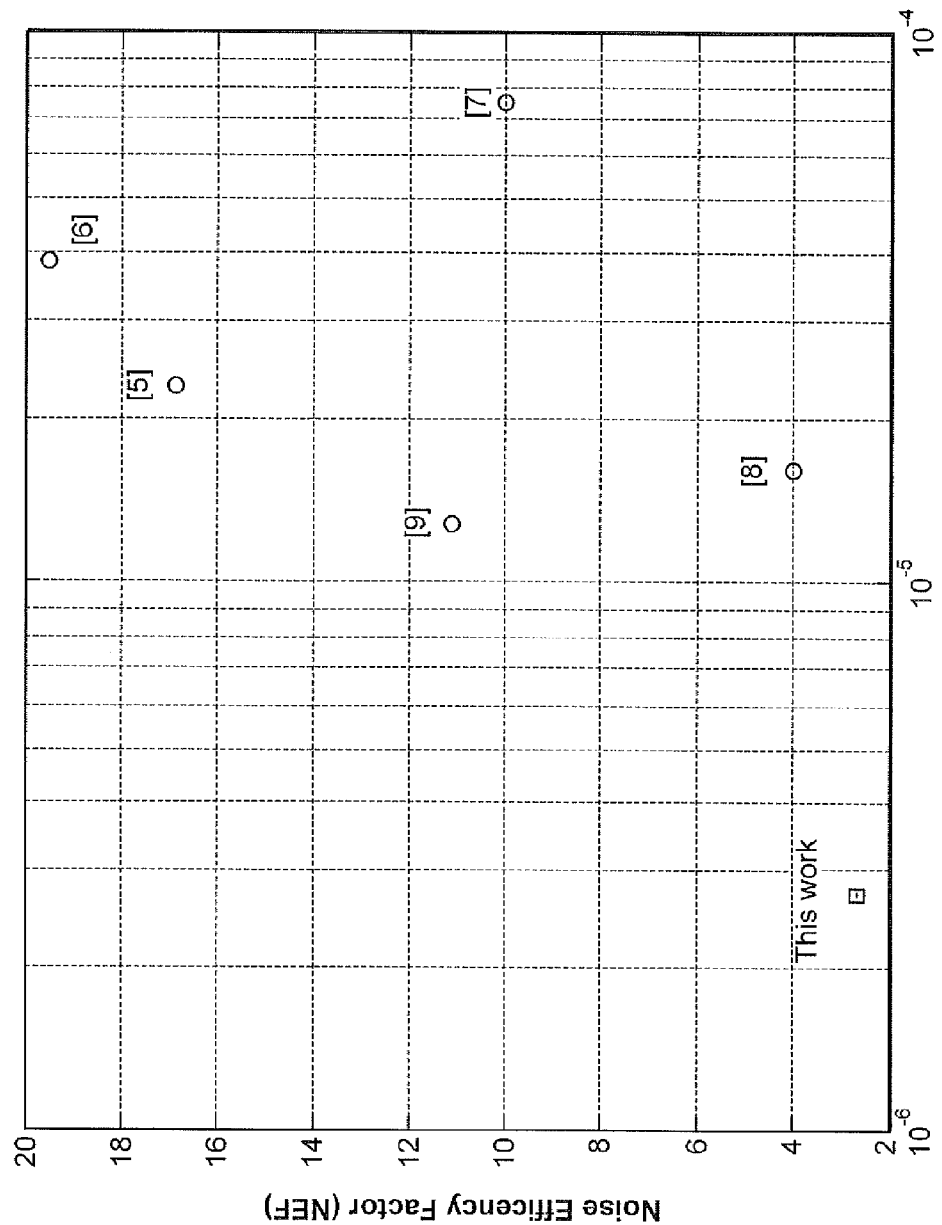
FIG. 11 is a graph illustrating noise efficiency factor (NEF) of neural amplifiers as a function of the total supply current.

The NEF of the amplifier is calculated from the achieved experimental measurements to be 2.67. This value is close to 2.02 which is the theoretical NEF limit and also near the expected theoretical calculation of 2.47. The good power-noise tradeoff of the amplifier is a result of minimizing the effective number of transistors that contribute noise. Moreover, almost all the power is consumed by the input-differential pair. Therefore, little power is wasted in less critical parts of the amplifier. FIG. 11 compares NEF of previously reported neural amplifiers as a function of the total supply current. The amplifier exhibits the best NEF and lowest power consumption reported to date.

Figure 12A:
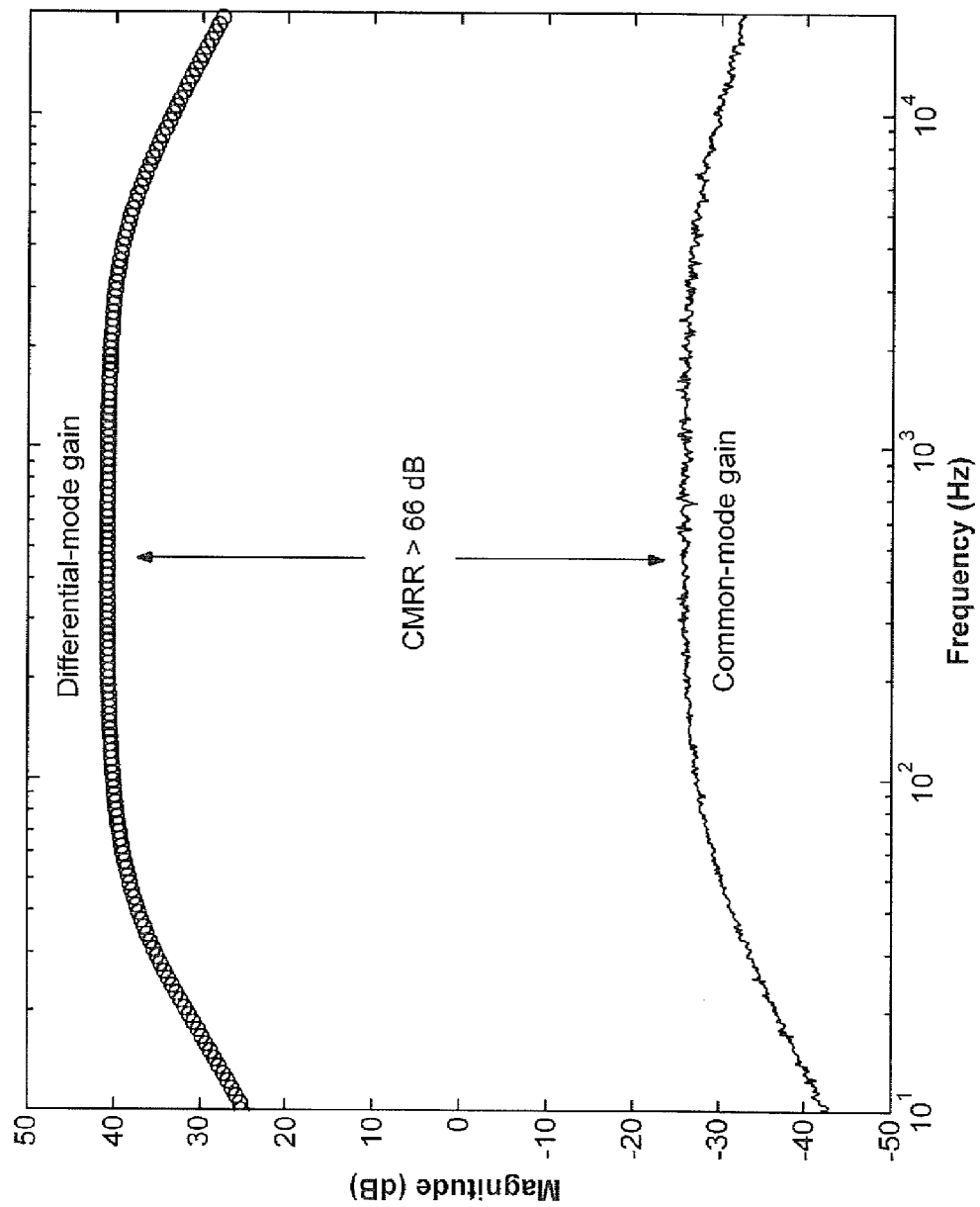
FIGS. 12A-12B are graphs illustrating CMRR and PSRR measurements of the neural amplifier configured for recording action potentials.
Figure 12B:
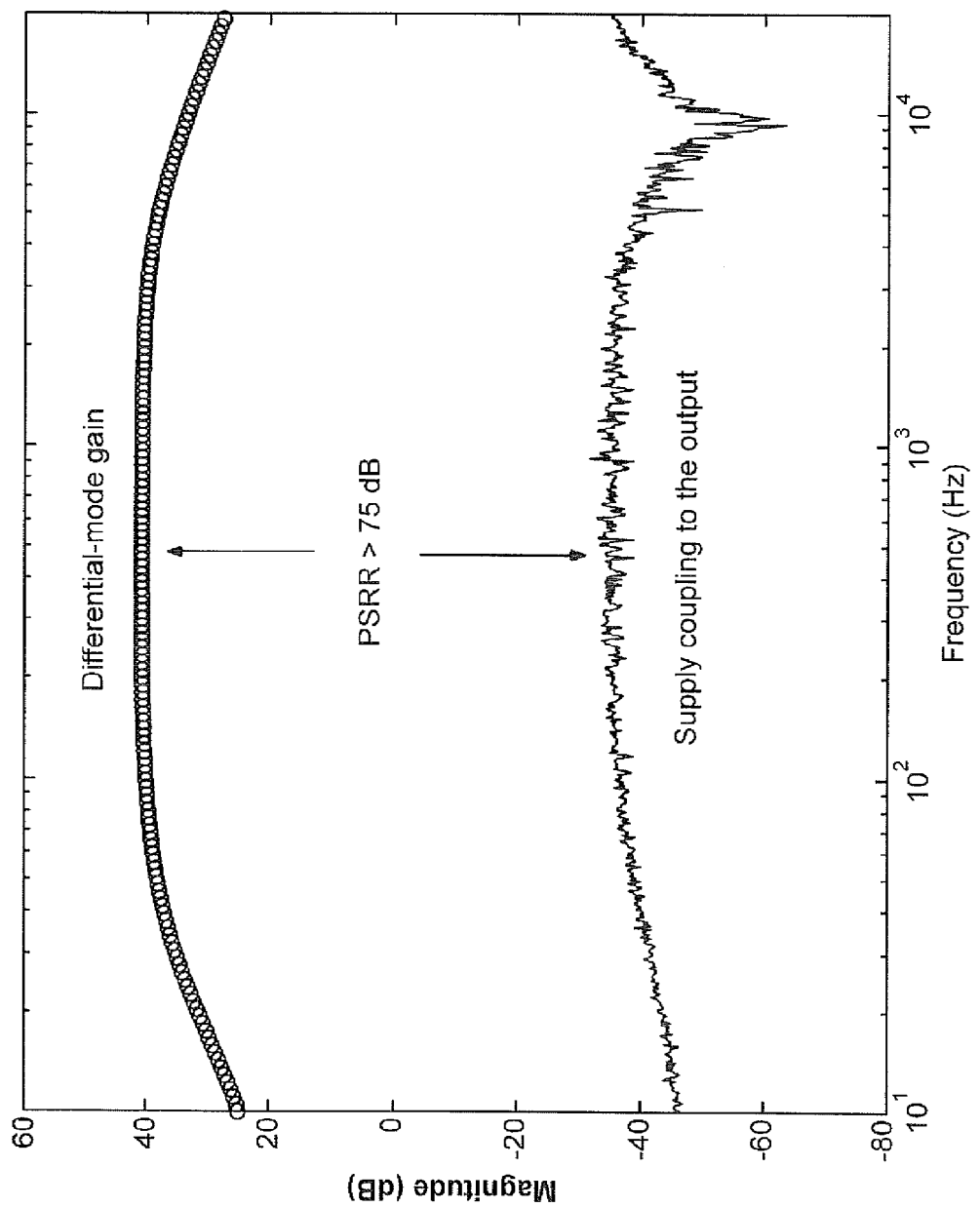

The measured CMRR and PSRR are shown in FIGS. 12A-12B respectively. CMRR is calculated as the ratio of the differential-mode gain to the common-mode gain. PSRR is calculated as the ratio of the differential-mode gain to the gain from power supply to the output. The measured CMRR and PSRR exceed 66 dB and 75 dB (over the range of 45 Hz to 5.32 kHz) respectively.

Figure 13A:
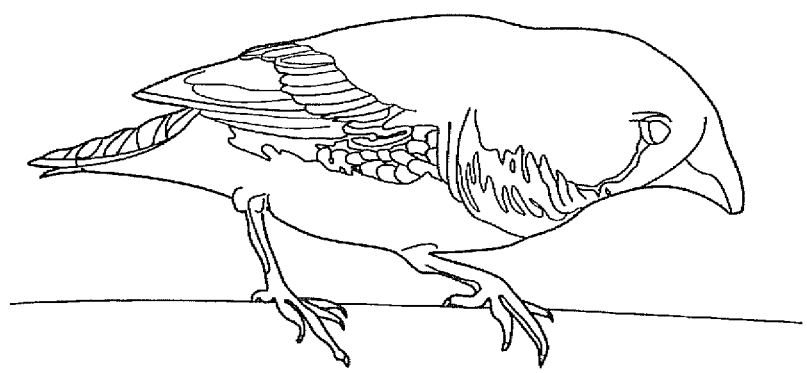
FIGS. 13A-13C illustrate a neural recording from a zebra finch's brain.
Figure 13B:
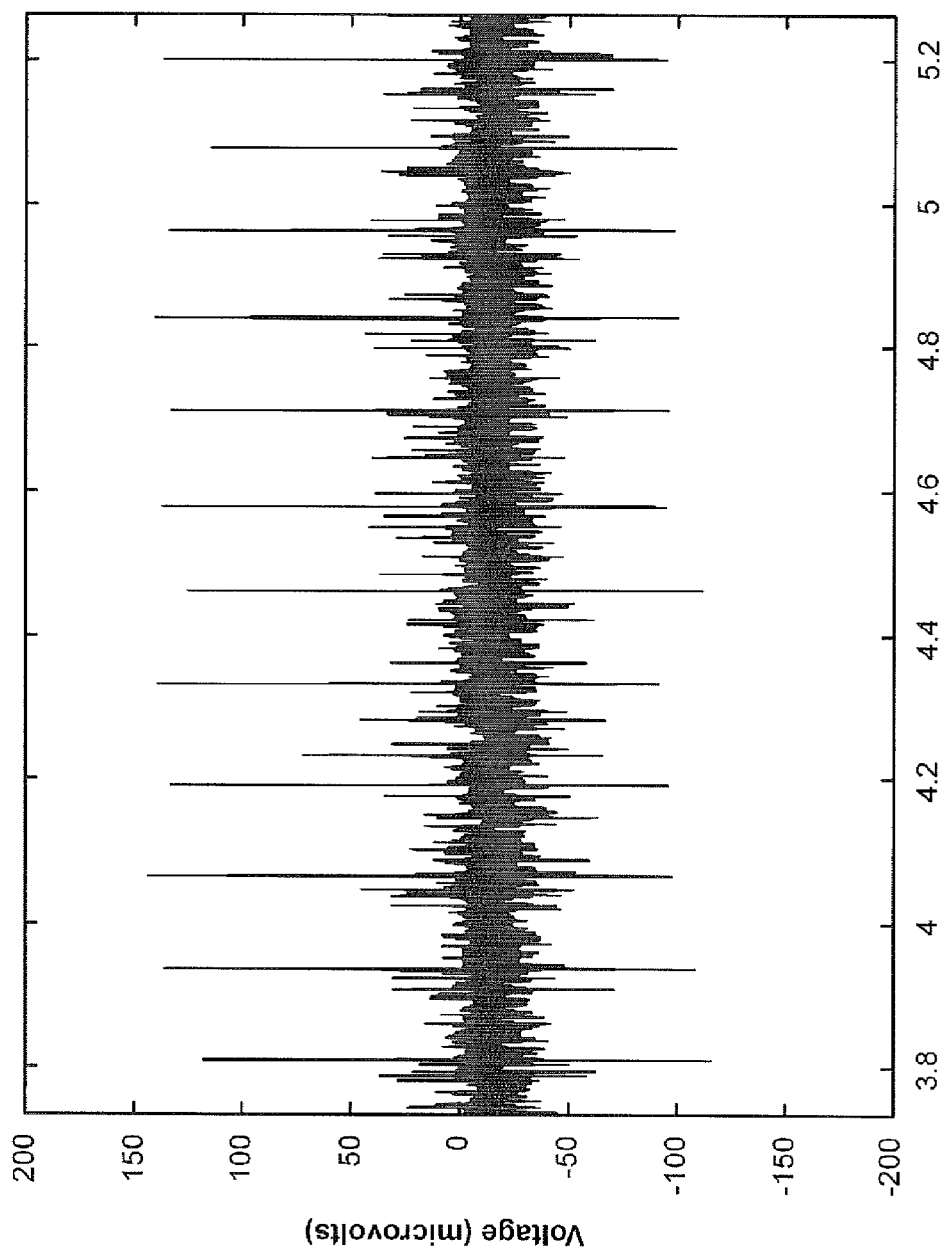
Figure 13C:
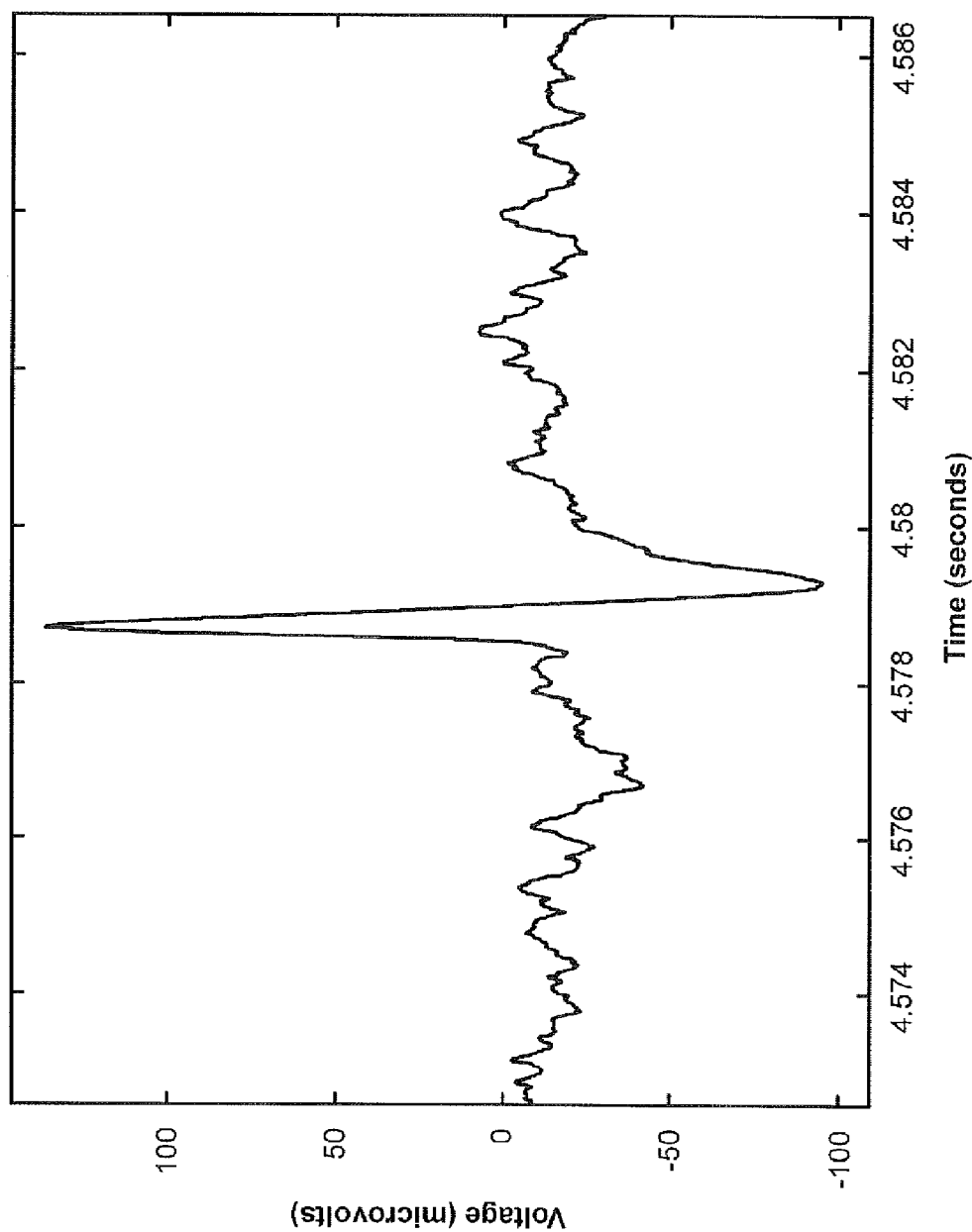

It has been verified the neural amplifier works in a real recording environment by using it to record action potentials in the RA region of a zebra finch's brain, as shown in FIG. 13A. Data were taken with a Carbostar electrode that had an impedance of approximately 800 kΩ. A long extracellular trace and a short extracellular trace recorded from the amplifier normalized by the gain are shown in FIGS. 13B-13C. They were found to be identical to that recorded by a commercial neural amplifier.

Local Field Potentials (LFPs) instead of action potentials are often used in some brain-machine interfaces, for example, those used in paralysis prosthetics. Therefore, one can also measure the performance characteristics of the amplifier configured with lower bandwidth (and power) for such applications. Since the LFP contains energy in the frequency range of 1 Hz to 100 Hz, one can simply lower the −3 dB lowpass cutoff frequency of the amplifier by lowering the supply current of the OTA in the bandpass filter stage. The highpass cutoff frequency can also be lowered to be below 1 Hz by adjusting $V_{tune}$. If one can just change the bandwidth in this manner, the input-referred noise of the amplifier becomes excessively low. From a hand-analysis, if one can adjust the bandwidth of the amplifier to be 0.5 Hz-300 Hz while maintaining the same supply current for the gain-stage OTA, the input-referred noise of the amplifier is less than 1 μVrms. Such low input-referred noise is unnecessary and is wasteful of power. From, the input-referred noise power is inversely proportional to $g_{m1}$, therefore inversely proportional to $I_1$. Thus, more power can be saved by lowering the current in the gain-stage OTA as well.

Figure 14A:
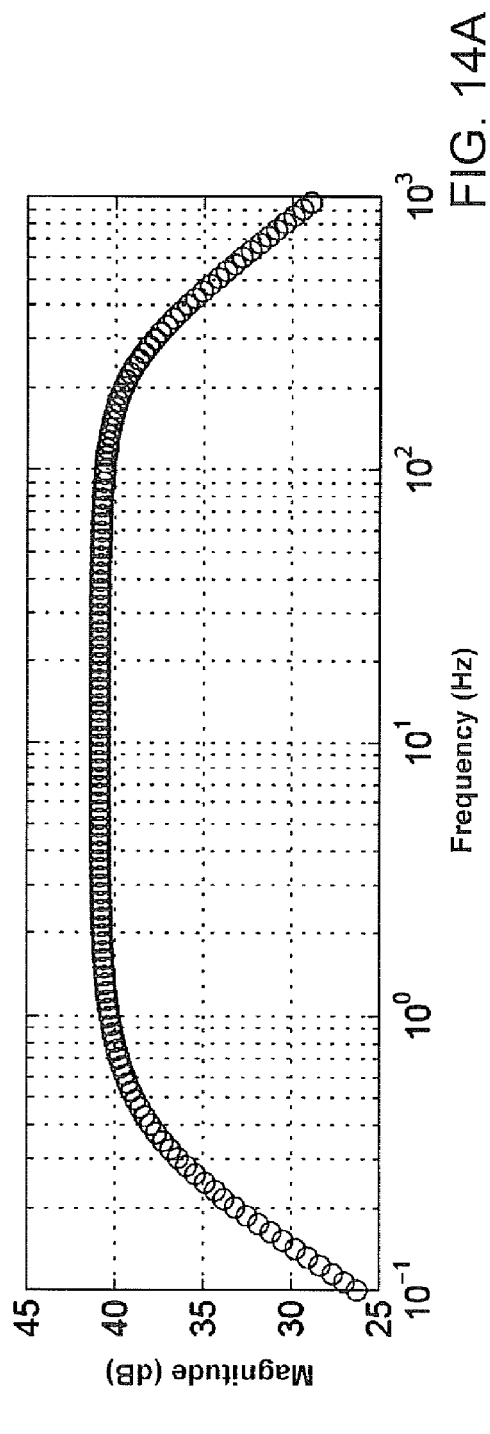
FIG. 14 is a graph illustrating the transfer function of the amplifier configured for recording Local Field Potentials (LFPs)
Figure 14B:
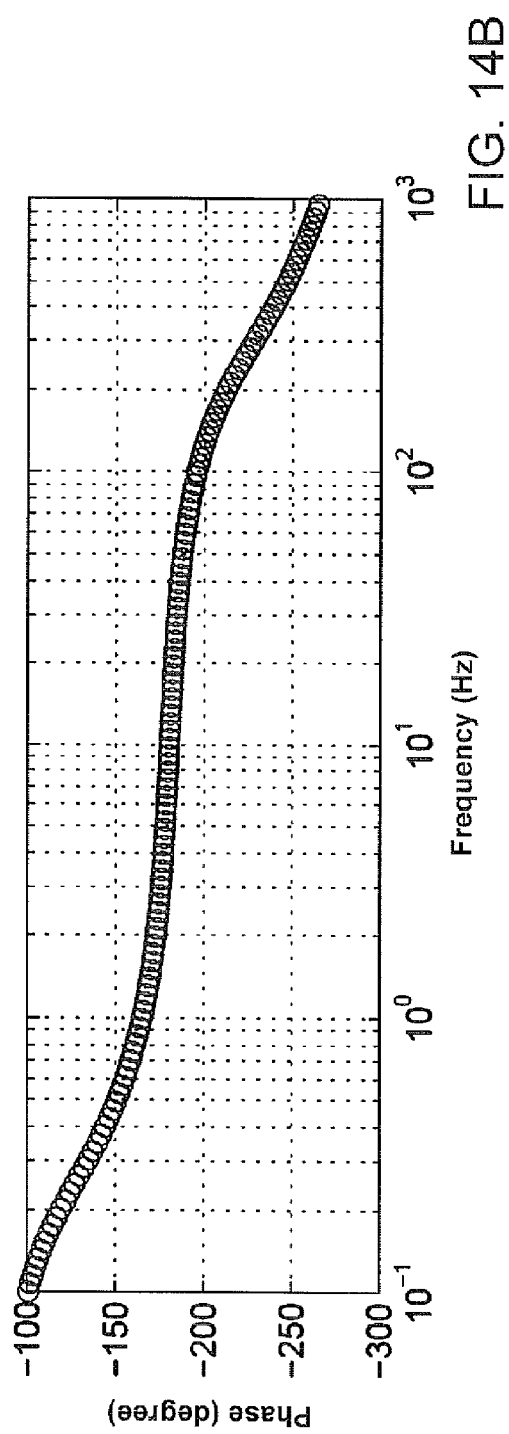
Figure 15:
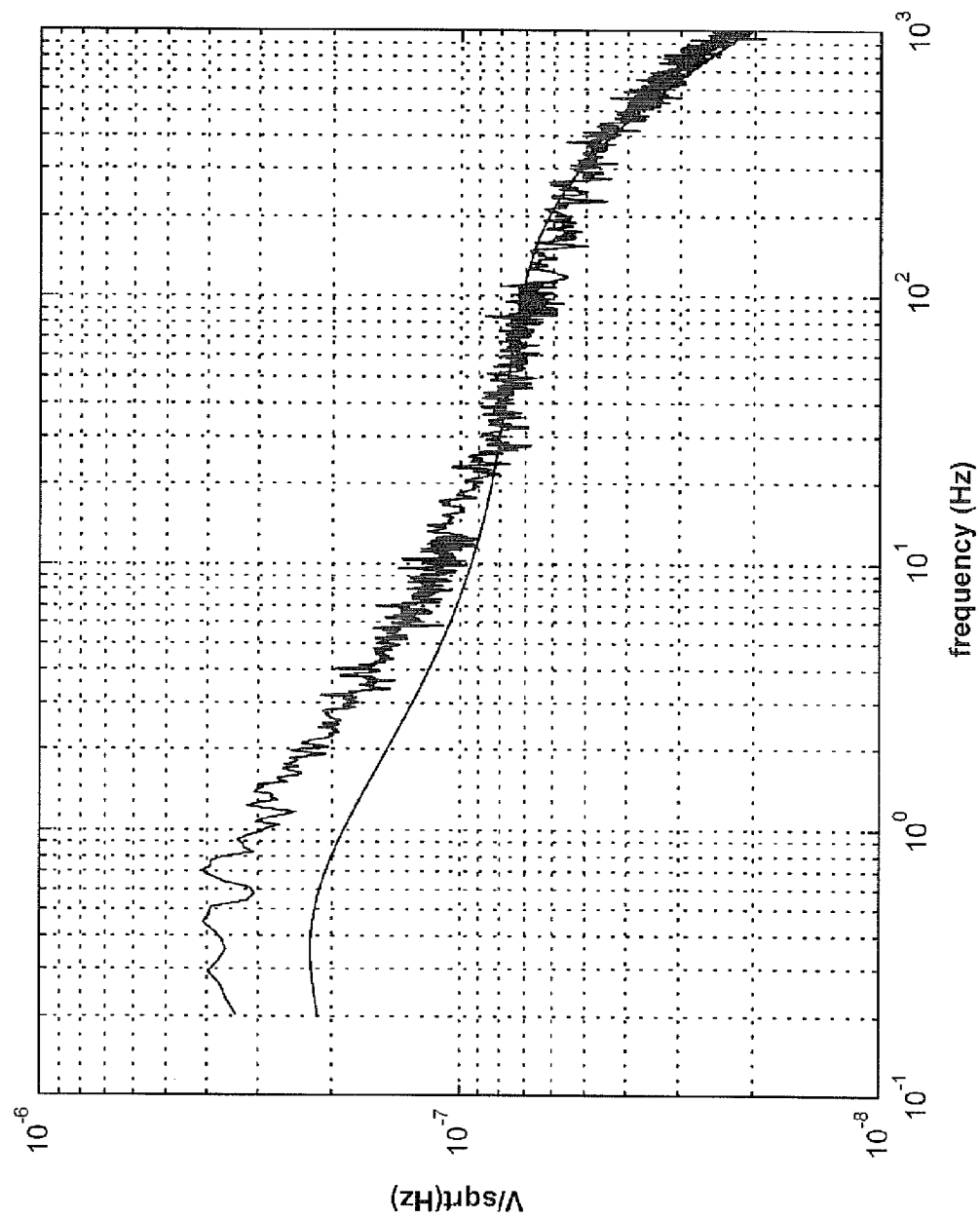
FIG. 15 is a graph illustrating the measured and simulated input-referred noise spectra for the amplifier configured for recording LFP.

The amplifier can be adjusted to have a highpass cutoff frequency of 392 mHz and a lowpass cutoff frequency of 295 Hz for LFP-suitable configuration. The total current of the amplifier was measured to be 743 nA, corresponding to a power consumption of 2.08 μW from a 2.8 V supply and 1.66 μVrms total input-referred noise integrated from 0.2 Hz to 1 kHz. The measured transfer function for the amplifier configured for recording LFP is shown in FIGS. 14A-14B. The measured input-referred noise spectrum and expected noise curve from simulation are shown in FIG. 15. The measured NEF for LFP recording is then 3.21, still better than any other amplifier to date. Note that the NEF is worse than that of the amplifier configured to record neural spikes. This degradation in NEF is due to the fact that the thermal noise from the resistors $R_1$ and $R_2$ becomes more significant once the current in the input differential pair is low. Moreover, 1/f noise becomes significant as well since the highpass cutoff has been decreased to 395 mHz.

The invention provides a micropower low-noise neural recording amplifier. Many low-noise design techniques were employed to enable the amplifier to achieve an input-referred noise near the theoretical limit of two devices of an input differential pair. The inventive amplifier appears to be the lowest power and most energy-efficient neural amplifier reported to date. It can be configured to record either action potentials or local field potentials. The inventive amplifier can thus be useful in brain-machine interfaces for paralysis prosthetics, visual prosthetics, or experimental neuroscience systems for chronic monitoring.

Although the present invention has been shown and described with respect to several preferred embodiments thereof, various changes, omissions and additions to the form and detail thereof, may be made therein, without departing from the spirit and scope of the invention.

What is claimed is:

1. A low-power amplifier with adaptive power biasing for use in multi-electrode arrays, wherein the amplifier is implemented using a modified version of a standard folded-cascode topology, the modification involving biasing an operational transconductance amplifier such that only currents in transistors of a folded branch are only a fraction of the current in the input differential pair transistors, whereby the fraction is achieved by controlling a resistance and controlling a transistor as a parallel combination of a first set of transistors while the input differential pair transistors are each constructed from a second set of transistors in parallel.

2. The low-power amplifier of claim 1, wherein said low power amplifier is implemented as a micropower amplifier array for neural signals.

3. The low-power amplifier of claim 1, wherein the adaptive power biasing scheme is based on statistical properties of the recorded signals.

4. A micropower neural amplifier with adaptive power biasing for use in multi-electrode arrays comprising:
   a low noise gain stage, said low noise gain stage implemented using an amplifier and pseudoresistor elements, wherein the amplifier is implemented using a modified version of a standard folded-cascode topology, the modification involving biasing an operational transconductance amplifier such that only currents in transistors of a folded branch are only a fraction of the current in the input differential pair transistors, whereby the fraction is achieved by controlling a resistance and controlling a transistor as a parallel combination of a plurality of a first set of transistors while the input differential pair transistors are each constructed from a plurality of a second set of transistors in parallel; and
   a band pass filter stage to shape a pass band of the amplifier.

5. The micropower neural amplifier of claim 4, wherein said micropower neural amplifier of claim 1 is able to record LFPs and neural spikes.

6. The micropower neural amplifier of claim 1, wherein reduction in currents is accomplished using a plurality of source-degenerated current mirrors.

7. The micropower neural amplifier of claim 4, wherein said amplifier is implemented in conjunction with a neuromotor prosthetic system.

8. A micropower neural amplifier with adaptive power biasing for use in multi-electrode arrays comprising:
   a low noise gain stage, said low noise gain stage implemented using an amplifier and pseudoresistor elements, said pseudoresistor element's noise being in the low frequencies, thereby allowing said low frequency noise to be filtered prior to pass band and does not appear in a frequency of interest, the amplifier is implemented using a modified version of a standard folded-cascode topology, the modification involving biasing an operational transconductance amplifier such that only currents in transistors of a folded branch are only a fraction of the current in the input differential pair transistors, whereby the fraction is achieved by controlling a resistance and controlling a transistor as a parallel combination of a plurality of a first set of transistors while said input differential pair transistors are each constructed from a plurality of a second set of transistors in parallel; and
   a band pass filter stage to shape a pass band of the amplifier.

9. The micropower neural amplifier of claim 8, wherein said micropower neural amplifier of claim 1 is able to record LFPs and neural spikes.

10. The micropower neural amplifier of claim 8, wherein reduction in currents is accomplished using a plurality of source-degenerated current mirrors.

11. The micropower neural amplifier of claim 8, wherein said amplifier is implemented in conjunction with a neuromotor prosthetic system.

12. A micropower neural amplifier with adaptive power biasing for use in multi-electrode arrays comprising:
   a low noise gain stage, said low noise gain stage implemented using an amplifier and pseudoresistor elements, said amplifier implemented using a modified version of a standard folded-cascode topology, the modification involving biasing an operational transconductance amplifier such that only currents in transistors of a folded branch are only a fraction of the current in the input differential pair transistors; and
   a band pass filter stage to shape a pass band of the amplifier.

13. The micropower neural amplifier of claim 12, wherein reduction in currents is accomplished using a plurality of source-degenerated current mirrors.

14. A method of forming a micropower neural amplifier with adaptive power biasing for use in multi-electrode arrays comprising:
   implementing a low noise gain stage using an amplifier and pseudoresistor elements, said pseudoresistor element's noise being in the low frequencies, thereby allowing said low frequency noise to be filtered prior to pass band and does not appear in a frequency of interest, wherein the amplifier is implemented using a modified version of a standard folded-cascode topology, the modification involving biasing an operational transconductance amplifier such that only currents in transistors of a folded branch are only a fraction of the current in the input differential pair transistors, whereby the fraction is achieved by controlling a resistance and controlling a transistor as a parallel combination of a plurality of a first set of transistors while said input differential pair transistors are each constructed from a plurality of a second set of transistors in parallel; and
   implementing a band pass filter stage to shape a pass band of the amplifier.

15. The method of claim 14, wherein said micropower is able to record LFPs and neural spikes.

16. The method of claim 14 wherein reduction in currents is accomplished using a plurality of source-degenerated current mirrors.

17. The method of claim 14, wherein said amplifier is implemented in conjunction with a neuromotor prosthetic system.

18. A method of performing operations of a micropower neural amplifier with adaptive power biasing for use in multi-electrode arrays comprising:
   utilizing an amplifier and pseudoresistor elements in a low noise gain stage, said pseudoresistor element's noise being in the low frequencies, thereby allowing said low frequency noise to be filtered prior to pass band and does not appear in a frequency of interest, wherein the amplifier is implemented using a modified version of a standard folded-cascode topology, the modification involving biasing an operational transconductance amplifier such that only currents in transistors of a folded branch are only a fraction of the current in the input differential pair transistors, whereby the fraction is achieved by controlling a resistance and controlling a transistor as a parallel combination of a plurality of a first set of transistors while said input differential pair transistors are each constructed from a plurality of a second set of transistors in parallel; and
   shaping a pass band of the amplifier in a band pass filter stage.

19. The method of claim 18, wherein said micropower is able to record LFPs and neural spikes.

20. The method of claim 18, wherein reduction in currents is accomplished using a plurality of source-degenerated current mirrors.

21. The method of claim 18, wherein said amplifier is implemented in conjunction with a neuromotor prosthetic system.

* * * * *